United States Patent
Hall

(10) Patent No.: US 11,531,511 B2
(45) Date of Patent: *Dec. 20, 2022

(54) MODULAR DISPLAY PANELS

(71) Applicant: Ultravision Technologies, LLC, Dallas, TX (US)

(72) Inventor: William Y. Hall, Dallas, TX (US)

(73) Assignee: Ultravision Technologies, LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/131,416

(22) Filed: Dec. 22, 2020

(65) Prior Publication Data

US 2021/0357171 A1 Nov. 18, 2021

Related U.S. Application Data

(63) Continuation of application No. 16/269,356, filed on Feb. 6, 2019, now Pat. No. 10,871,932, which is a
(Continued)

(51) Int. Cl.
*G09G 5/00* (2006.01)
*G06F 3/14* (2006.01)
(Continued)

(52) U.S. Cl.
CPC ............ *G06F 3/1446* (2013.01); *G06F 3/147* (2013.01); *G06F 3/1438* (2013.01); *G06T 1/60* (2013.01);
(Continued)

(58) Field of Classification Search
CPC ...... G06F 3/1438; G06F 3/1446; G06F 3/147; G06T 1/60; G09G 2300/026;
(Continued)

(56) References Cited

U.S. PATENT DOCUMENTS

| 2009/0073080 A1* | 3/2009 | Meersman | G02F 1/13336 |
| | | | 345/1.3 |
| 2010/0295760 A1* | 11/2010 | Somerville | G09G 3/3216 |
| | | | 345/82 |
| 2014/0268565 A1* | 9/2014 | Cox | H05K 5/0017 |
| | | | 361/730 |

OTHER PUBLICATIONS

*Ultravision Technologies, LLC v. Shenzhen Absen Optoelectronic Co., Ltd., Absen, Inc.*, "Amended Final Judgement," In the United States District Court for the Eastern District of Texas Marshall Division, Civil Action No. 2:18-CV-00112-JRG, Sep. 15, 2021, 3 pages.

(Continued)

*Primary Examiner* — Insa Sadio
(74) *Attorney, Agent, or Firm* — Slater Matsil, LLP

(57) ABSTRACT

An embodiment modular light-emitting diode (LED) display panel includes attachment points for use in attachment as part of a multi-panel modular LED display, a printed circuit board including a first side and an opposite second side, and a plastic casing attached to the opposite second side of the printed circuit board. A perimeter of the plastic casing is substantially rectangular and has a height and a width. The modular LED display panel further includes a display surface including a plurality of LEDs arranged as pixels and attached to the first side of the printed circuit board. The pixels are arranged in a rectangular array including at least fifty pixels. Each of the pixels of the rectangular array is spaced from each respective adjacent pixel of the rectangular array by a pitch. The pitch is a predetermined constant number. The pitch does not depend on the height and the width.

20 Claims, 26 Drawing Sheets

Related U.S. Application Data continuation of application No. 15/409,288, filed on Jan. 18, 2017, now Pat. No. 10,248,372, which is a continuation of application No. 14/550,685, filed on Nov. 21, 2014, now Pat. No. 9,582,237.

(60) Provisional application No. 62/065,510, filed on Oct. 17, 2014, provisional application No. 62/025,463, filed on Jul. 16, 2014, provisional application No. 61/922,631, filed on Dec. 31, 2013.

(51) Int. Cl.
| | |
|---|---|
| *H01H 11/04* | (2006.01) |
| *G09G 5/36* | (2006.01) |
| *H05K 13/00* | (2006.01) |
| *G09G 3/32* | (2016.01) |
| *G06T 1/60* | (2006.01) |
| *G06F 3/147* | (2006.01) |
| *G09G 3/20* | (2006.01) |
| *H05K 1/18* | (2006.01) |
| *H05K 5/00* | (2006.01) |
| *H05K 5/02* | (2006.01) |
| *H05K 5/04* | (2006.01) |
| *H05K 5/06* | (2006.01) |

(52) U.S. Cl.
CPC .............. *G09G 3/2096* (2013.01); *G09G 3/32* (2013.01); *G09G 5/006* (2013.01); *G09G 5/363* (2013.01); *H01H 11/04* (2013.01); *H05K 1/18* (2013.01); *H05K 5/0017* (2013.01); *H05K 5/0247* (2013.01); *H05K 5/04* (2013.01); *H05K 5/06* (2013.01); *H05K 13/00* (2013.01); *G09G 3/2088* (2013.01); *G09G 2300/026* (2013.01); *G09G 2310/0286* (2013.01); *G09G 2340/14* (2013.01); *G09G 2360/04* (2013.01); *G09G 2360/06* (2013.01); *G09G 2380/06* (2013.01); *H05K 2201/10106* (2013.01); *Y10T 29/49002* (2015.01); *Y10T 29/49007* (2015.01); *Y10T 29/49105* (2015.01)

(58) Field of Classification Search
CPC ....... G09G 2310/0286; G09G 2340/14; G09G 2360/04; G09G 2360/06; G09G 2380/06; G09G 3/2088; G09G 3/2096; G09G 3/32; G09G 5/006; G09G 5/363; H01H 11/04; H05K 13/00; H05K 1/18; H05K 2201/10106; H05K 5/0017; H05K 5/0247; H05K 5/04; H05K 5/06; Y10T 29/49002; Y10T 29/49007; Y10T 29/49105

See application file for complete search history.

(56) References Cited

OTHER PUBLICATIONS

*Ultravision Technologies, LLC v. Govision LLC,* "Claim Construction Memorandum and Order," In the United States District Court for the Eastern District of Texas Marshall Division, Case No. 2:18-CV-00100-JRG-RSP Lead Case, Sep. 30, 2020, 86 pages.

* cited by examiner

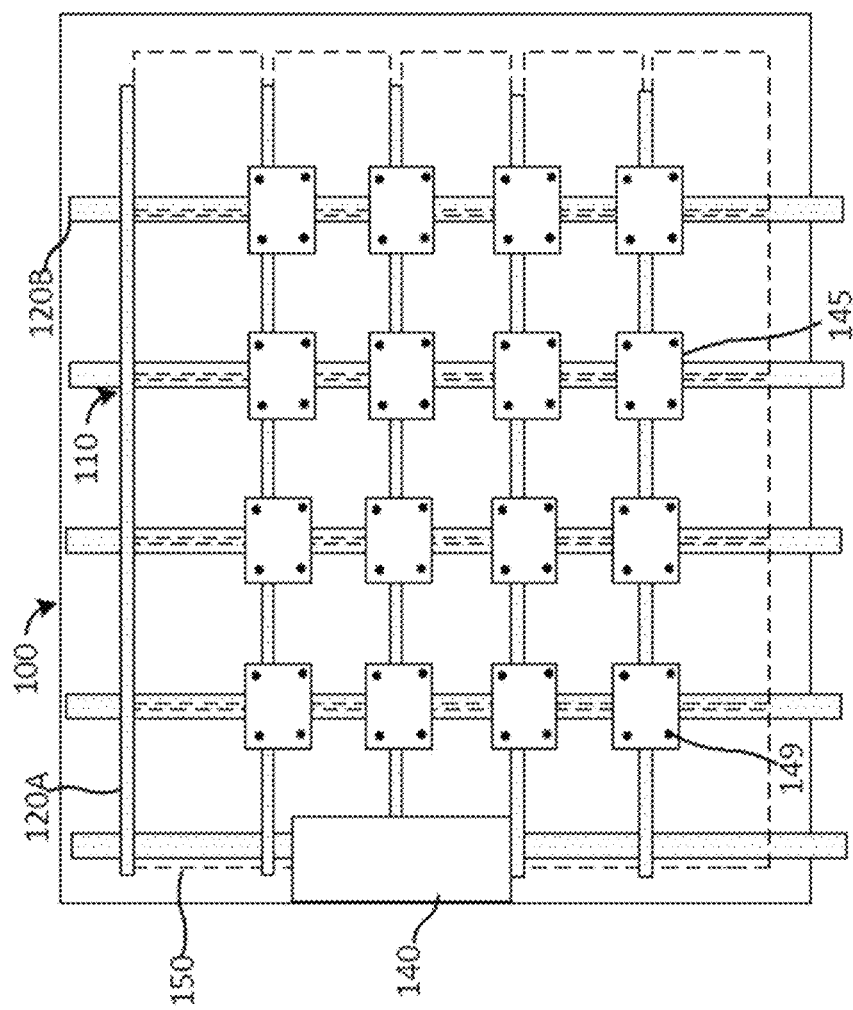

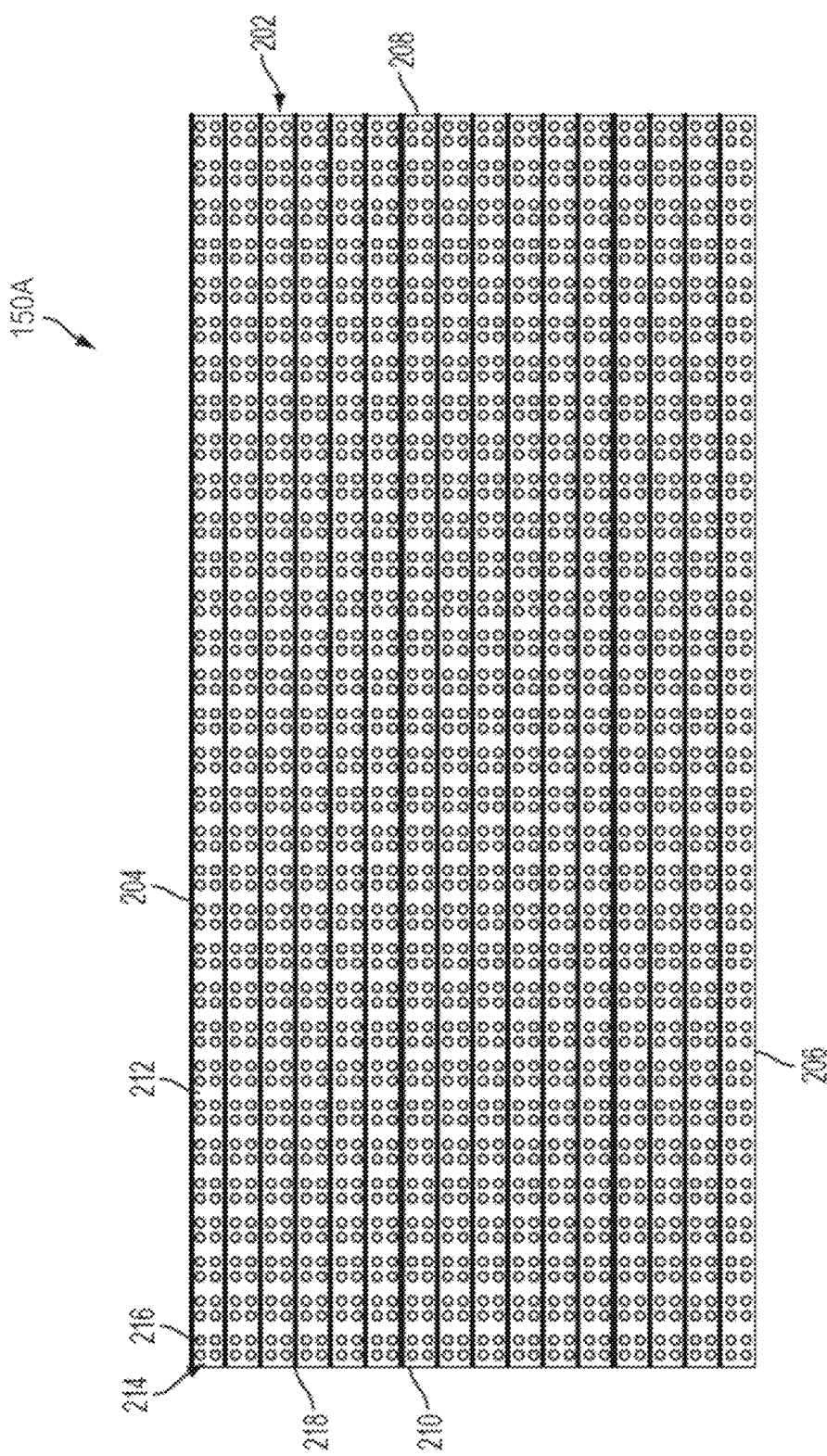

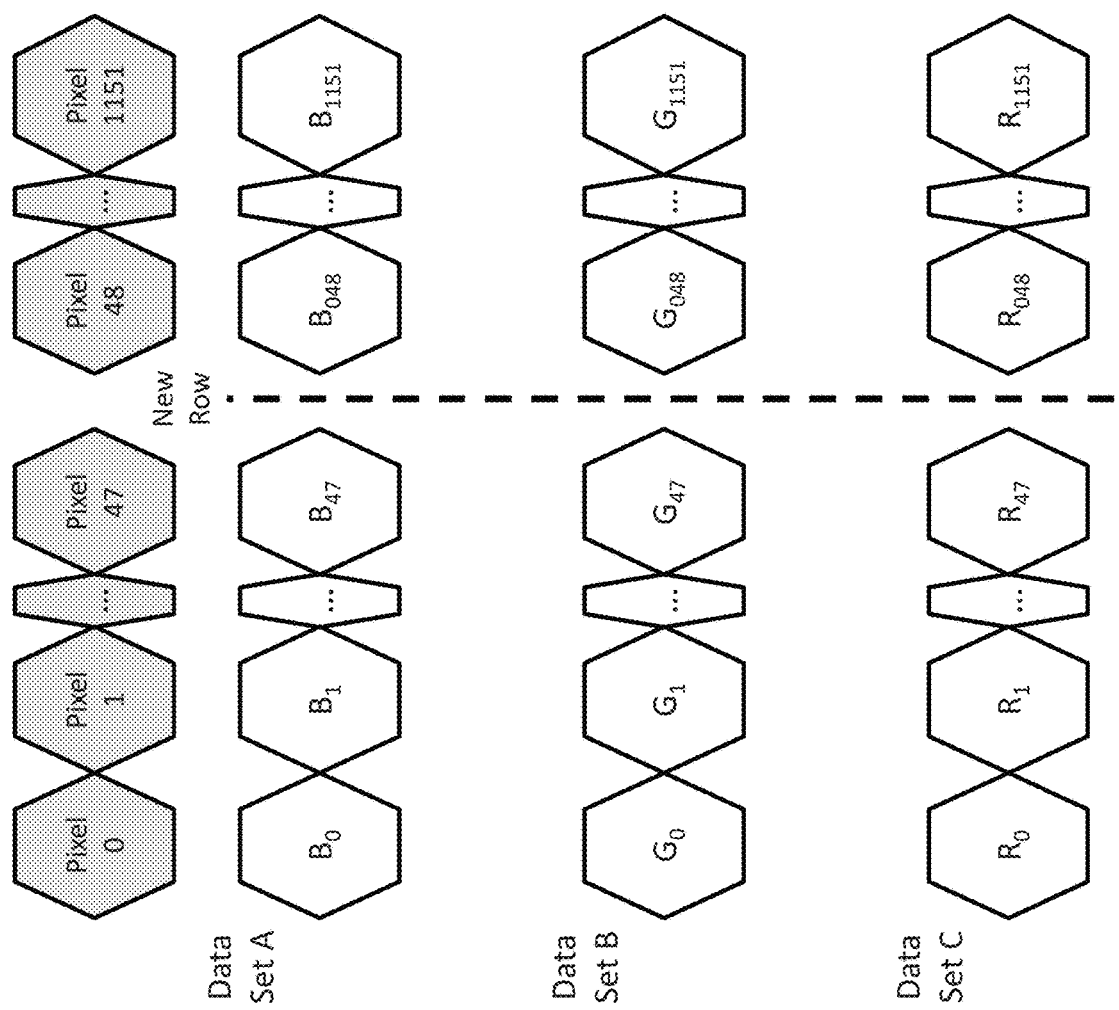

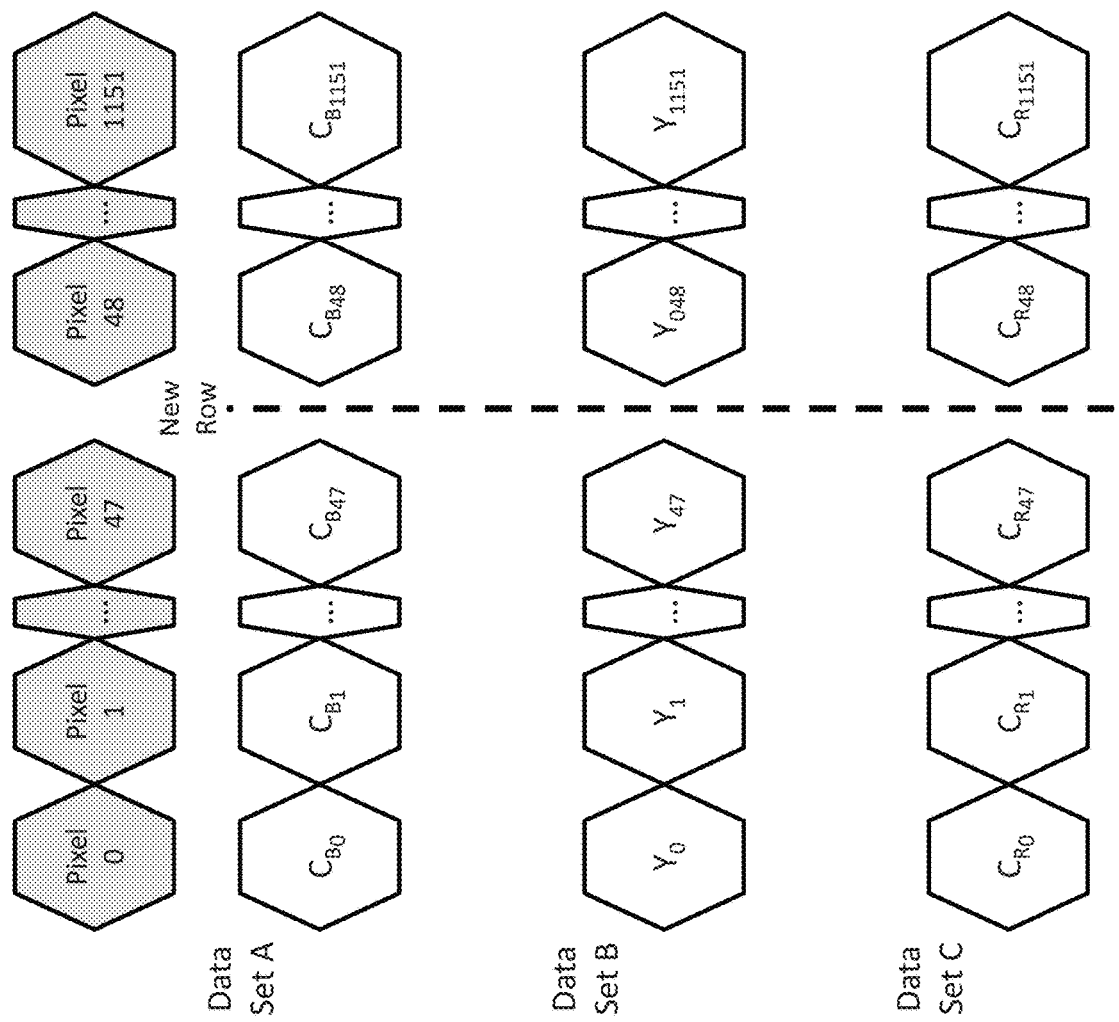

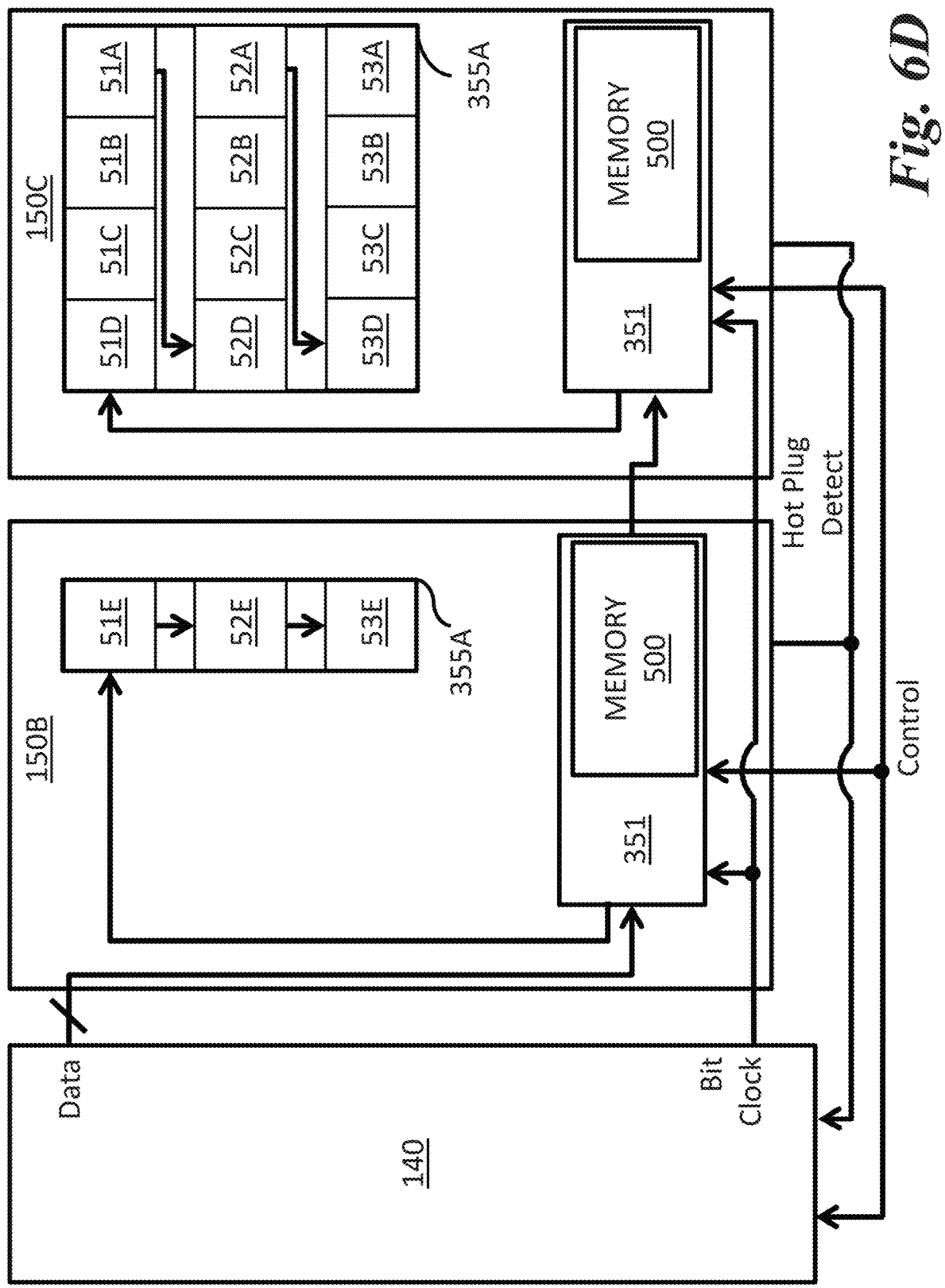

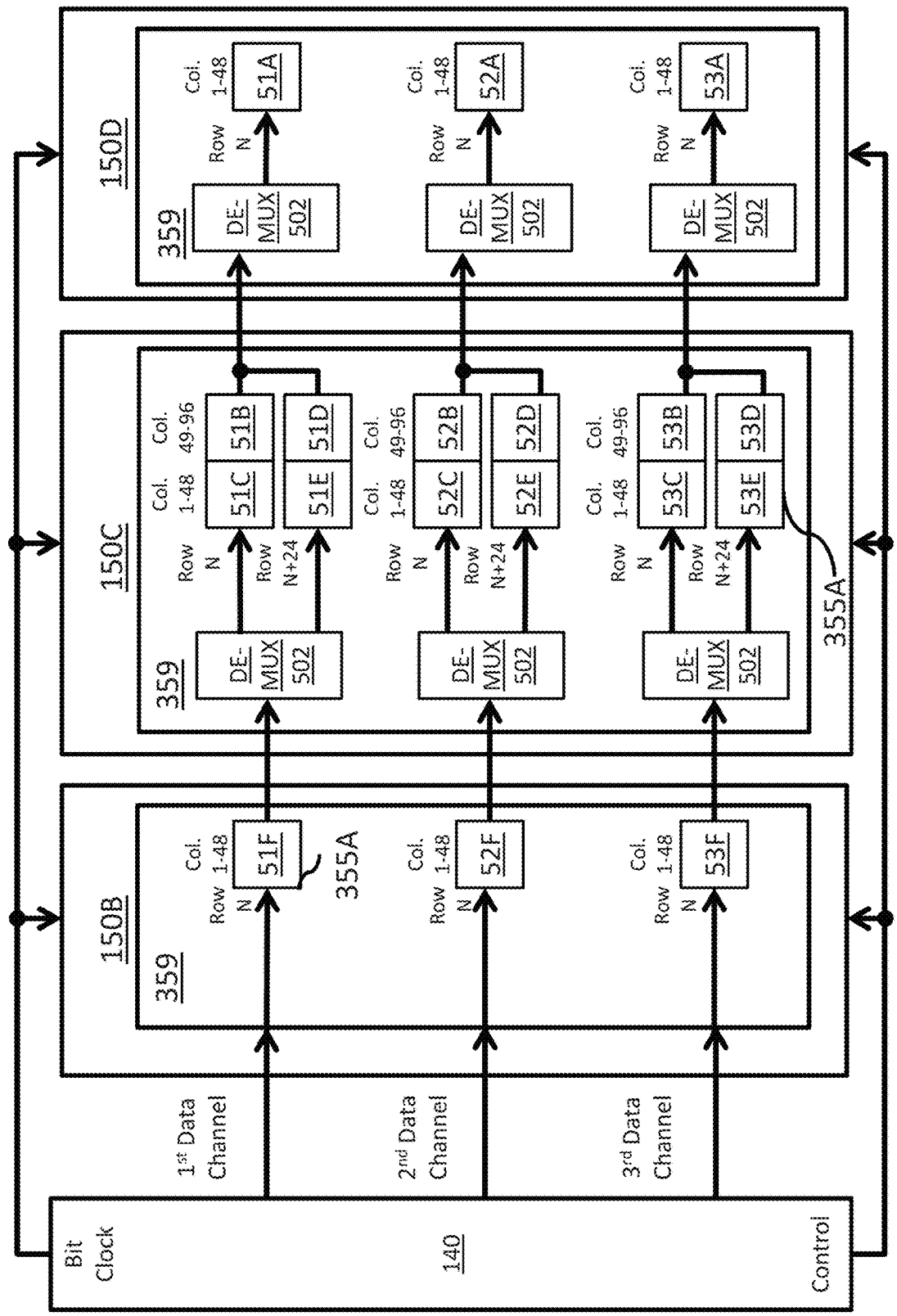

MODULAR DISPLAY PANELS

CROSS-REFERENCE TO RELATED APPLICATIONS

This application is a continuation application of U.S. application Ser. No. 16/269,356, filed on Feb. 6, 2019, now issued as U.S. Pat. No. 10,871,932, which is a continuation application of U.S. application Ser. No. 15/409,288, filed on Jan. 18, 2017, now issued as U.S. Pat. No. 10,248,372, which is a continuation application of U.S. application Ser. No. 14/550,685, filed on Nov. 21, 2014, now issued as U.S. Pat. No. 9,582,237, which claims the benefit of U.S. Provisional Application No. 62/065,510, filed on Oct. 17, 2014, U.S. Provisional Application No. 62/025,463, filed on Jul. 16, 2014, and U.S. Provisional Application No. 61/922,631, filed on Dec. 31, 2013, which applications are hereby incorporated herein by reference.

TECHNICAL FIELD

The present invention relates generally to displays, and, in particular embodiments, to a system and method for a modular LED display panels with different pitches.

BACKGROUND

Large displays (e.g., billboards), such as those commonly used for advertising in cities and along roads, generally have one or more pictures and/or text that are to be displayed under various light and weather conditions. As technology has advanced and introduced new lighting devices such as the light emitting diode (LED), such advances have been applied to large displays.

An LED display is a flat panel display, which uses an array of light-emitting diodes. A large display may be made of a single LED display or a panel of smaller LED panels. LED panels may be conventional panels made using discrete LEDs or surface-mounted device (SMD) panels. Most outdoor screens and some indoor screens are built around discrete LEDs, which are also known as individually mounted LEDs. A cluster of red, green, and blue diodes, or alternatively, a tri-color diode, is driven together to form a full-color pixel, usually square in shape. These pixels are spaced evenly apart and are measured from center to center for absolute pixel resolution.

Many LED display manufacturers sell displays with different resolutions. A present disadvantage of these LED displays is that each one must be a different size to accommodate the pitch needed to obtain the desired resolution. In turn, the existing cabinets and mounting structures must be built to be suitable with the size of the displays.

SUMMARY

Example embodiments of the present disclosure provide a system and method for modular LED display panels with different pitches.

In accordance with an example embodiment of the present invention, a method of manufacturing modular panels is provided. The method includes manufacturing a group of modular LED display panels, including a first and second modular LED display panel that have the same size and shape. The first modular LED display panel includes a first pixel array arranged at a first pitch, and the second modular LED display panel includes a second pixel array that is arranged at a second pitch that is different than the first pitch. Any two modular LED display panels in the group are capable of being attached to each other in an integrated display system.

In accordance with another example embodiment of the present invention, a product portfolio is provided. The product portfolio includes a group of modular LED display panels, including a first and second modular LED display panel that have the same size and shape. The first modular LED display panel includes a first pixel array arranged at a first pitch, and the second modular LED display panel includes a second pixel array that is arranged at a second pitch that is different than the first pitch. Any two modular LED display panels in the group are capable of being attached to each other in an integrated display system.

In accordance with another example embodiment of the present invention, a modular display system is provided. The display system includes a mechanical support structure and a group of display panels mounted to the mechanical support structure to form an integrated display panel. The mechanical structure is configured to provide mechanical support to the group of display panels, which include a first display panel and a second display panel each having the same size and shape. The first display panel includes a power source, a first pixel array having a first display resolution and a first pitch, and a first controller coupled to the power source. The second display panel includes a second pixel array having a second display resolution and a second pitch.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1A-1B, illustrates a modular multi-resolution display system in accordance with embodiments of the present invention;

FIG. 2, which includes FIGS. 2A and 2B, illustrates one embodiment of an LED panel that may be used as one of the LED panels in the modular multi-resolution display system;

FIG. 3, which includes

FIG. 5, which includes FIGS. 5A-5G, illustrates embodiment formats for digitally storing video data in video memory buffers of LED panels;

FIG. 6, which includes FIGS. 6A-6E, illustrates embodiment signaling configurations for transmitting data from a data source to LED panels;

FIG. 7, which includes

DETAILED DESCRIPTION OF ILLUSTRATIVE EMBODIMENTS

Figure 1A:
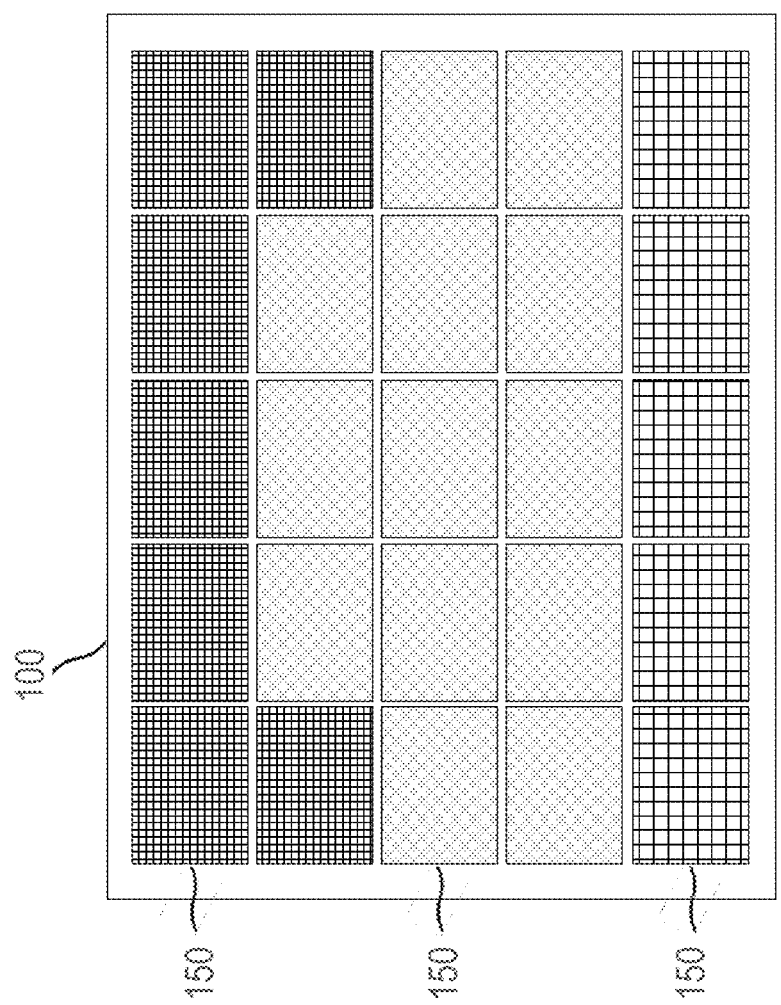

Embodiments of the invention provide display panels, each of which provides a completely self-contained building block that is lightweight. These displays are designed to protect against weather, without a heavy cabinet, although it is understood that the present disclosure may be applied to lighting for any type of interior and/or exterior display. The lightweight design allows for easier installation and maintenance, thus lowering total cost of ownership.

In embodiments of the present invention, a number of different resolution display panels are manufactured and sold but each of these panels is made to have the same physical dimensions. This approach saves cost because standard-size components can be used for the various models of displays that are available. Instead of maintaining inventory of eight different size housings for a product line that includes eight different resolution display panels, a single inventory can be kept, which will lower inventory costs.

Embodiments of the invention provide building block panels that are configurable with future expandability. These displays can offer complete expandability to upgrade in the future without having to replace the entire display. Installation is fast and easy with very little down-time, which allows any electronic message to be presented more quickly.

In some embodiments, the display panels are "hot swappable." By removing one screw in each of the four corners of the panel, servicing the display is fast and easy. Since a highly-trained, highly-paid electrician or technician is not needed to correct a problem, cost benefits can be achieved.

Various embodiments utilize enhanced pixel technology (EPT), which increases image capability. EPT allows image displays in the physical pitch spacing, but also has the ability to display the image in a resolution that is four-times greater.

Embodiments of the present invention will be described in further detail below. A modular multi-panel display system comprising display panels of differing resolutions to a frame will be described using FIG. 1. An embodiment method for initially setting up the modular multi-panel display will be described using FIG. 8. Various embodiments of display panels may be used in the modular multi-panel display, for example, as illustrated below in FIGS. 2 and 3. The panels are then electrically connected to a data source, as described further with respect to FIG. 4. As will be next described using FIG. 5, the transmitted data may be stored in the panels using various signaling formats. The data to be stored is then transmitted to the panels from a data source in accordance with various signaling configurations, as will be described in FIG. 6. Using FIG. 9, an embodiment method for configuring and displaying data on the modular multi-panel display will be described. Various electronic components of individual panels may be interconnected to support the signaling configurations of the modular display as illustrated in FIG. 7.

Referring now to FIG. 1, a modular multi-resolution display system in accordance with embodiments of the present invention is illustrated. FIG. 1A is a front view of a display system that includes display panels of different resolutions. FIG. 1B is a rear view of the display system that illustrates the frame for mounting the display panels.

Referring to FIG. 1A, in this particular example, three different resolution display panels are used, but it is understood that any configuration could be used. For example, Table 1 provides an example of the pitches used for a product line that includes eight different resolution display panels. A single system could include panels with each of the eight pitches shown in Table 1. The software driving the display would provide image data to each panel in a manner appropriate for that panel. Each of the panels in Table 1 is one foot by two feet in dimensions, as an example. The pitch and type of LED used is provided in the table. The pitch is the distance between any two pixels in the panel, and the type of LED may be, for example, a Surface Mount Device (SMD) or a Dual Inline Package (DIP).

TABLE 1

| |
|---|
| 6.35 mm SMD Physical |
| 7.62 mm SMD Physical |
| 9.525 mm SMD Physical |
| 12.7 mm SMD Physical |
| 15.24 mm DIP Physical |
| 19.05 mm DIP Virtual |
| 25.4 mm DIP Virtual |
| 30.48 mm DIP Virtual |

Referring to FIG. 1A, this particular example shows a display 100 with an arbitrarily chosen 25 LED display panels 150 comprising three different resolution panels. In the present embodiment, the LED display panels 150 use LEDs for illumination, but it is understood that other light sources may be used in other embodiments. One of the advantages of the building block like configuration of the display panels is that any number of panels can be used to create integrated display systems of many sizes and shapes. For example, a display 100 could include 336 panels that are each 1'×2' in dimension to create a 14'×48' display. In such a display, because each panel is lighter than typical panels, the entire display could be built to weigh only 5500 pounds. This compares favorably to commercially available displays of the size, which generally weigh from 10,000 to 12,000 pounds. In another embodiment, a display 100 could include 320 LED display panels 150 arranged in ten rows and thirty-two columns so that the integrated display panel 100 has a display surface that is approximately fifty feet and four inches wide and fifteen feet and eight and three-quarters inches high. In other embodiments, displays with an arbitrary number of panels can be used.

The LED display panels 150 in the embodiment of FIG. 1A typically operate together to form a single image, although multiple images may be simultaneously presented by the display 100. Two or more LED display panels 150 can be coupled for power and/or data purposes, with an LED display panel 150 receiving power and/or data from a central source or another panel and passing through at least some of the power and/or data to one or more other panels. This further improves the modular aspect of the display 100, as a single LED display panel 150 can be easily connected to the display 100 when being installed and easily disconnected when being removed by decoupling the power and data connections from neighboring panels.

The power and data connections for the LED display panels 150 may be configured using one or more layouts, such as a ring, mesh, star, bus, tree, line, or fully-connected layout, or a combination thereof. In some embodiments the LED display panels 150 may be in a single network, while in other embodiments the LED display panels 150 may be divided into multiple networks. Power and data may be distributed using identical or different layouts. For example, power may be distributed in a line layout, while data may use a combination of line and star layouts.

In the embodiment of FIG. 1A, the bottom row has a first resolution such as, for example, a low resolution that is used for captions or other text. The top and corners use a second resolution, for example, a medium resolution to be used for background portions of the image. The center of the display, on the other hand, may have a higher resolution. This region would be capable of showing a more detailed image. Such a configuration is possible because the housings of all of the display panels are the same size and configuration regardless of the resolution. This allows a user to tailor the number of each panel type to gain the best tradeoff between cost and image quality.

Referring to FIGS. 1A and 1B, it is also noted that the uniform size and configuration of the panels enables the panels to be interchanged as needed. More specifically, as panels have an identical footprint in terms of height H, width W, and depth D1, their position on the frame 110 of FIG. 1B does not matter from a size standpoint, but only from a functionality standpoint. Accordingly, the design of the display 100 may then focus on issues such as the required resolution for a particular position and/or other issues such as weight and cost without the need to be concerned with how a particular panel will physically fit into a position on the frame.

Referring to FIG. 1B, the LED display panels 150 are individually attached to a frame 110, which enables each LED display panel to be installed or removed from the frame 110 without affecting the other panels. Each LED display panel 150 is a self-contained unit that couples directly to the frame 110. By "directly," it is understood that another component or components may be positioned between the LED display panel 150 and the frame 110, but the panel is not placed inside a cabinet that is coupled to the frame 110. For example, in this embodiment attachment plates 145 are coupled to the LED display panels 150 and to the frame 110. Other embodiments use an alignment plate, which is a plate that couples to the housing of a panel and to the frame 110 and also interlocks with other alignment plates of adjacent panels, to aid in aligning the panel with adjacent panels. Further the panel may be coupled to the frame no without the use of any attachment plates or alignment plates. Whether the panel is coupled to the frame 110, attachment plate 145, and/or the alignment plate, any of these coupling approaches would be "direct" according to the present disclosure.

The attachment plate 145 (or an alignment plate) could be a solid material such as a metal plate or could be a conforming material such as a rubber material embedded with metal particles. In either case, it is desirable that the plate be thermally conductive. One or more attachment features 149 may be used to connect the attachment plate 145 to the LED display panel 150. In the embodiment illustrated in FIGS. 1B and 1C, the attachment plate 145 is a corner plate. Each corner plate is mechanically connected to corners of four of the LED display panels 150 to secure the LED display panels 150 to the horizontal beams 120A and vertical beams 120B of the frame 110.

The frame 110 comprises a plurality of horizontal beams 120A and vertical beams 120B forming the mechanical structure. The frame 110 may be relatively light in weight compared to frames needed to support cabinet mounted LED assemblies. In one embodiment, both horizontal beams 120A and vertical beams 120B may be used to support the LED display panels 150. In another embodiment, horizontal beams 120A but not the vertical beams 120B may be used to support the LED display panels 150. In a third embodiment, vertical beams 120B but not the horizontal beams 120A may be used to support the LED display panels 150.

The frame 110 may include support structures for the electrical cables, data cables, electrical power box powering the LED displays panels 150 and receiver unit 140 controlling power, data, and communication to the LED displays panels. However, the frame 110 does not include any additional enclosures to protect the LED panels, data, power cables from the environment. Rather, the frame 110 is exposed to the elements and further exposes the LED display panels 150 to the environment. The frame 110 also does not include air conditioning, fans, heating units to maintain the temperature of the LED display panels 150. Rather, the LED display panels 150 are hermetically sealed themselves and are designed to be exposed to the outside ambient. Further, in various embodiments, there are not additional cabinets that are attached to the frame 110 or used for housing the LED display panels 150. Accordingly, in various embodiments, the multi-panel modular display, LED display panel 150 is designed to be only passively cooled.

Figure 2B:
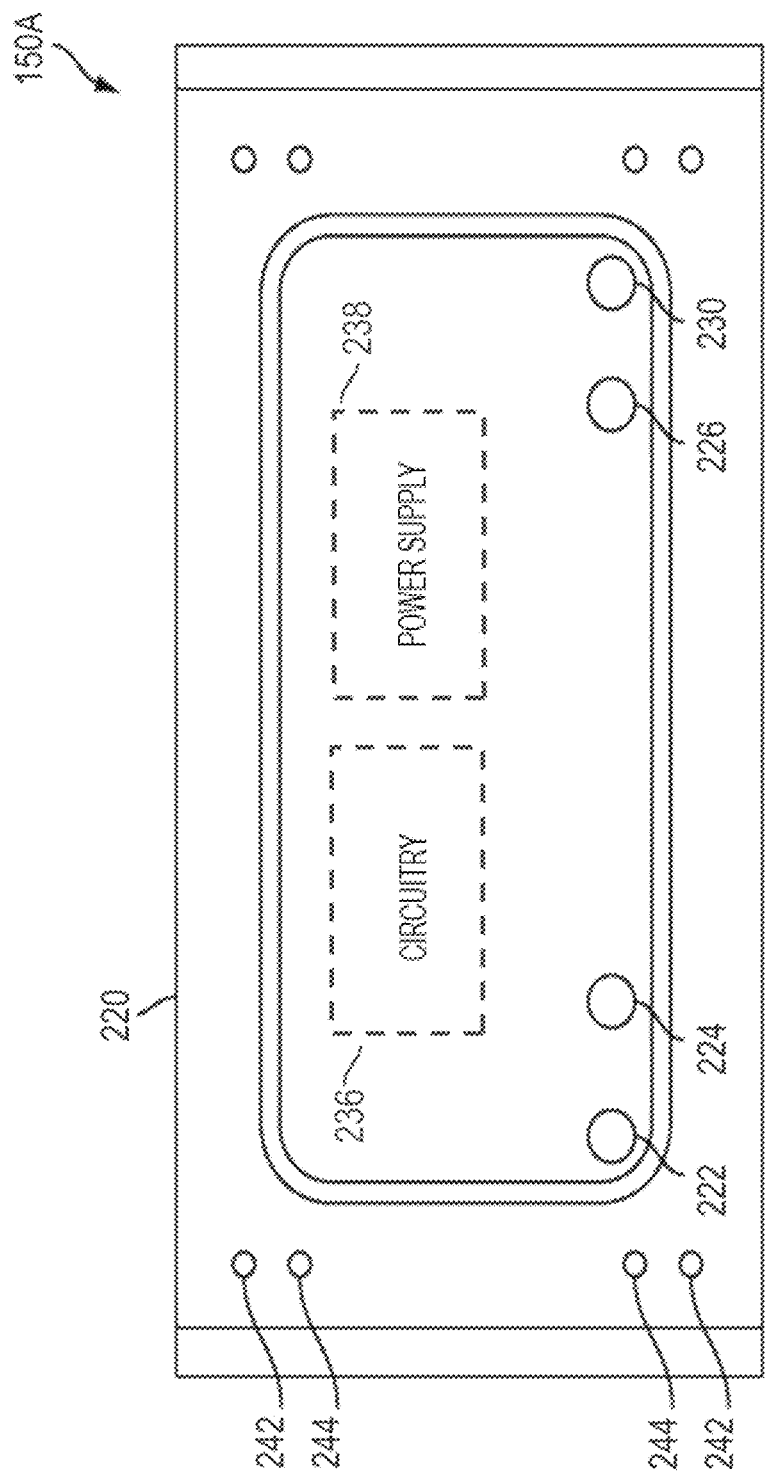

FIGS. 2A-2B illustrate one embodiment of a panel 150A that may be used as one of the LED display panels 150 of FIGS. 1A-1C. FIG. 2A illustrates a front view of the embodiment panel 150A with LEDs aligned in a 16×32 configuration. FIG. 2B illustrates a back view of the panel of this embodiment panel 150A.

Referring to FIG. 2A, an embodiment panel 150A includes a substrate 202 that forms a front surface of the panel 150A. The substrate 202 in the present embodiment is rectangular in shape, with a top edge 204, a bottom edge 206, a right edge 208, and a left edge 210. A substrate surface 212 includes "pixels" 214 that are formed by one or more LEDs 216 on or within the substrate 202. The substrate 202 may form the front surface of the panel 150A, but may not be the outer surface in some embodiments. For example, a transparent or translucent material or coating may overlay the substrate 202 and the LEDs 216, thereby being positioned between the substrate 202/LEDs 216 and the environment. In the present example, each pixel 214 includes four LEDs 216 arranged in a pattern (e.g., a square). For example, the four LEDs 216 that form a pixel 214 may include a red LED, a green LED, a blue LED, and one other LED (e.g., a white LED, a second red LED, etc.). In some embodiments, the other LED may be a sensor. It is understood that more or fewer LEDs 216 may be used to form a single pixel 214, and the use of four LEDs 216 and their relative positioning as a square is for purposes of illustration only. In an embodiment, a single tri-color LED having red, green, and blue inputs forms a single pixel.

Referring to FIG. 2B, the back of panel 150A is illustrated. In the present example, the panel 150A includes coupling points 242 and 244. The panel 150A also has a number of connection points that include a "power in" point 222, a first data point 224, a second data point 226, and a "power out" point 230. One embodiment of the invention provides for an integrated data and power cable, which reduces the number of ports. The power in point 222 enables the panel 150A to receive power from a power source, which may be another panel. In an embodiment, the first data point 224 is a "data in" point that enables the panel to receive data from a data source, which may be another panel, and the second data point 226 is a "data out" point that enables the panel 150A to send data to another panel. In an embodiment where the first data point 224 and second data point 226 are bi-directional, they may each enable the panel 150A to send data to one or more other panels and to receive data from those panels. In other embodiments, the data points can be directional connection points. The power out point 230 enables the panel 150A to send power to another panel.

The connection points may be provided in various ways. For example, in one embodiment, the connection points may be jacks configured to receive corresponding plugs. In another embodiment, a cable may extend from the back panel with a connector (e.g., a jack or plug) affixed to the external end of the cable to provide an interface for another connector. It is understood that the connection points may be positioned and organized in many different ways.

Inside the panel, the power in point 222 and power out point 230 may be coupled to circuitry 236 as well as to the power supply 238. In such embodiments, the circuitry 236 may aid in regulating the reception and transmission of power. In other embodiments, the power in point 222 and power out point 230 may be coupled only to the power supply 238 with a pass through power connection allowing some of the received power to be passed from the power in point 222 to the power out point 230. In some embodiments, the circuitry 236 may identify data used for the panel 150A and also send all data on to other coupled panels via the second data point 226. In such embodiments, the other panels would then identify the information relevant to that particular panel from the data. In other embodiments, the circuitry 236 may remove the data needed for the panel 150A and selectively send data on to other coupled panels via the second data point 226. For example, the circuitry 236 may send only data corresponding to a particular panel to that panel rather than sending all data and letting the panel identify the corresponding data. In some embodiments, the circuitry 236 may include a network receiver card for receiving data over a wide area network, local area network (LAN), or wireless LAN (WLAN).

Figure 3A:
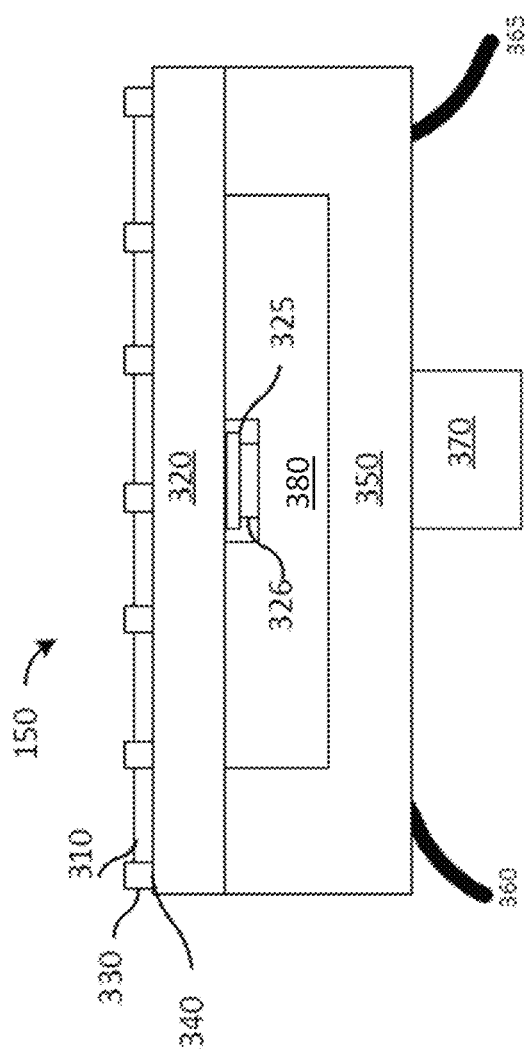
FIGS. 3A and 3B, illustrates a cross-sectional view and receiver circuit diagram of an embodiment LED panel.
Figure 3B:
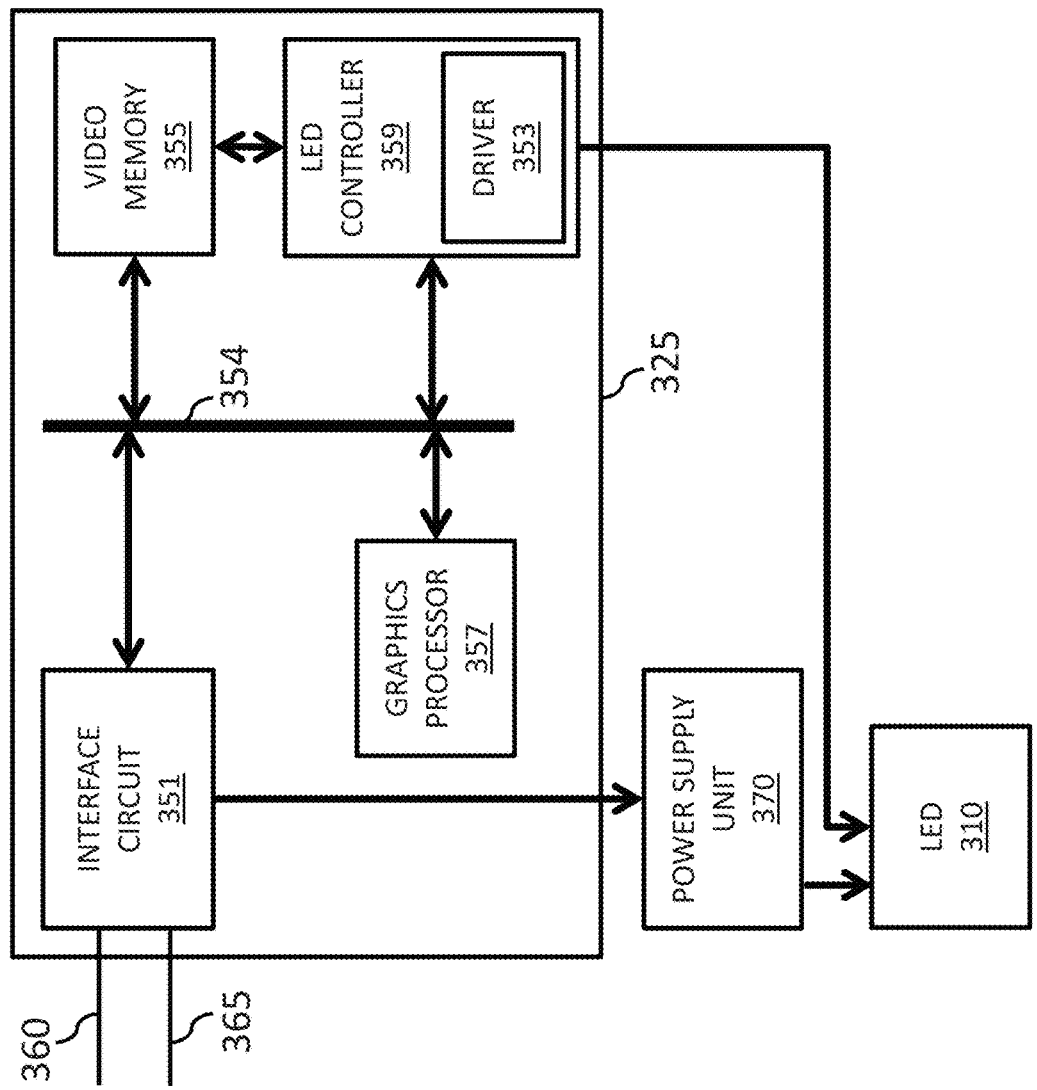

FIG. 3A illustrates a cross-sectional view of a second embodiment of an LED display panel 150. FIG. 3B illustrates an embodiment receiver circuit 325 of the LED display panel 150.

Referring to FIG. 3A, the casing 350 of the modular LED display panel 150 has openings through which a first cable 360 and a second cable 365 may be attached. The LED display panels 150 are electrically connected together for data and for power using the first cable 360 and second cable 365. In some embodiments, the first cable 360 is an input cable and the second cable 365 is an output cable. Each modular LED display panel 150 is capable of receiving input using an integrated data and power cable from a preceding modular LED display panel and providing an output using another integrated data and power cable to a succeeding modular LED display panel. Each cable ends with an endpoint device or connector, which is a socket or alternatively a plug.

The modular LED display panel 150 also comprises a plurality of LEDs 310 mounted on one or more printed circuit boards (PCBs) 320, which are housed within a hermetically sealed enclosure or casing. A framework of louvers 330 is attached to the PCB 320 using an adhesive 340, which prevents moisture from reaching the PCB. The LEDs 310 may be directly exposed to the ambient in the direction of light emission or may be covered by a transparent or translucent material or coating. A heat sink 380 is attached between the PCB 320 and the casing 350 and contacts both the PCB 320 and the casing 350 to maximize heat extraction.

A receiver circuit 325 is mounted on the PCB 320. The receiver circuit 325 may be a single chip in one embodiment. Alternatively, multiple components may be mounted on the PCB 320. The receiver circuit 325 may be configured to process the received media and control the operation of the individual LEDs 310. For example, when a single tri-color LED is used to form each pixel, the receiver circuit 325 determines the color and brightness of the LED 310 to be displayed at each pixel by, for example, adjusting the current or pulse width of a plurality of signals applied to the red, green, and blue input pins of the LED 310. When multiple single-color LEDs are used to form each pixel, the receiver circuit 325 determines the brightness of each LED 310 within each pixel by, for example, adjusting the current or pulse width of a single signal applied to the LED 310. A power supply unit 370 may be mounted over the casing 350 for powering the LEDs 310.

Referring to FIG. 3B, a data and power signal received at first cable 360 is processed at an interface circuit 351 of receiver circuit 325. The incoming power is provided to a power supply unit 370.

Another output from the incoming power is provided to second cable 365. This provides redundancy so that even if a component in the LED display panel 150 is not working, the output power is not disturbed. Similarly, second cable 365 includes all the data being received in first cable 360.

In this embodiment, the interface circuit 351 provides the received data to the graphics processor 357 through a data bus 354. In some embodiments, the interface circuit 351 provides only the data segments intended for the LED display panel 150. In other embodiments, the interface circuit 351 provides all incoming data to the graphics processor 357. For example, the graphics processor 357 may perform any necessary decoding or (when signaling between panels is analog) analog-to-digital conversion of the received media. In other embodiments, the interface circuit 351 interfaces directly with the LED controller 359 without use of a graphics processor 357. In the embodiment of FIG. 3B, the graphics processor 357, LED controller 359, or interface circuit 351 may use the buffer video memory 355 as needed to store video segments during processing. In some embodiments, the buffer video memory 355 may be a component of the LED controller 359. The buffer video memory 355 may also be used to digitally store video segments temporarily until the receiver circuit 325 collects enough data for simultaneous display by the LEDs 310. This collection of data may be a video frame for simultaneous display by all of the LEDs of the display panel, or it may be a smaller portion of data for display by a subset of the LEDs in accordance with, for example, a scanning pattern. The buffer video memory 355 may also be used to temporarily store video segments destined for other display panels.

The LED controller 359, which may include an address decoder (e.g., a demultiplexer), receives the media to be displayed and identifies individual LEDs in the LEDs 310 that need to be controlled. The LED controller 359 may determine an individual LED's color, brightness, refresh time, and other parameters associated to generate the display. For example, at each pixel location in the display, the color of the pixel may be selected by powering one or more combination of red, blue, green, and white LEDs. The LED controller 359 may include control circuitry such as a row selector and column selector for determining LED parameters as an example. In one embodiment, the LED controller 359 may provide these LED parameters to the current driver 353, which acts as either a current source or a current sink to select the appropriate current for the particular LED. In some embodiments, the current driver 353 acts as a current source or sink to provide a constant current with a constant pulse width to the LEDs 310. In other embodiments, the current driver 353 varies the duty cycle of a constant current to pulse width modulate the brightness of the LEDs 310. The current driver 353 may either be a component of the LED controller 359 or may be located outside the LED controller 359, such as, for example, being located inside the power supply unit 370.

The power supply unit 370 may include, for example, a power converter for converting ac to dc, which is supplied to the LEDs 310. Alternatively, the power supply unit 370 may include a down converter that down converts the voltage suitable for driving the LEDs 310. In one embodiment, the power supply unit includes a scan controller that interfaces directly with the LEDs 310. For example, the current driver 353 may provide a constant current to the LEDs 310 while a scan controller of the power supply unit 370 controls the select line needed to turn ON or OFF a particular LED. In some embodiments, a scan controller of the power supply unit 370 is implemented as an array of switches or transistors that switches incoming power to a selected row or column of LEDs 310. In other embodiments, the scan controller switches the output of the LED controller 359 to a selected row or column. The scan controller switches the LED controller output or power in accordance with, for example, an LED address, a row address, a column address, a pre-configured scanning pattern for scan groups of linked LEDs that should be activated simultaneously, or a scan select signal that specifies which scan group should be activated.

Figure 4:
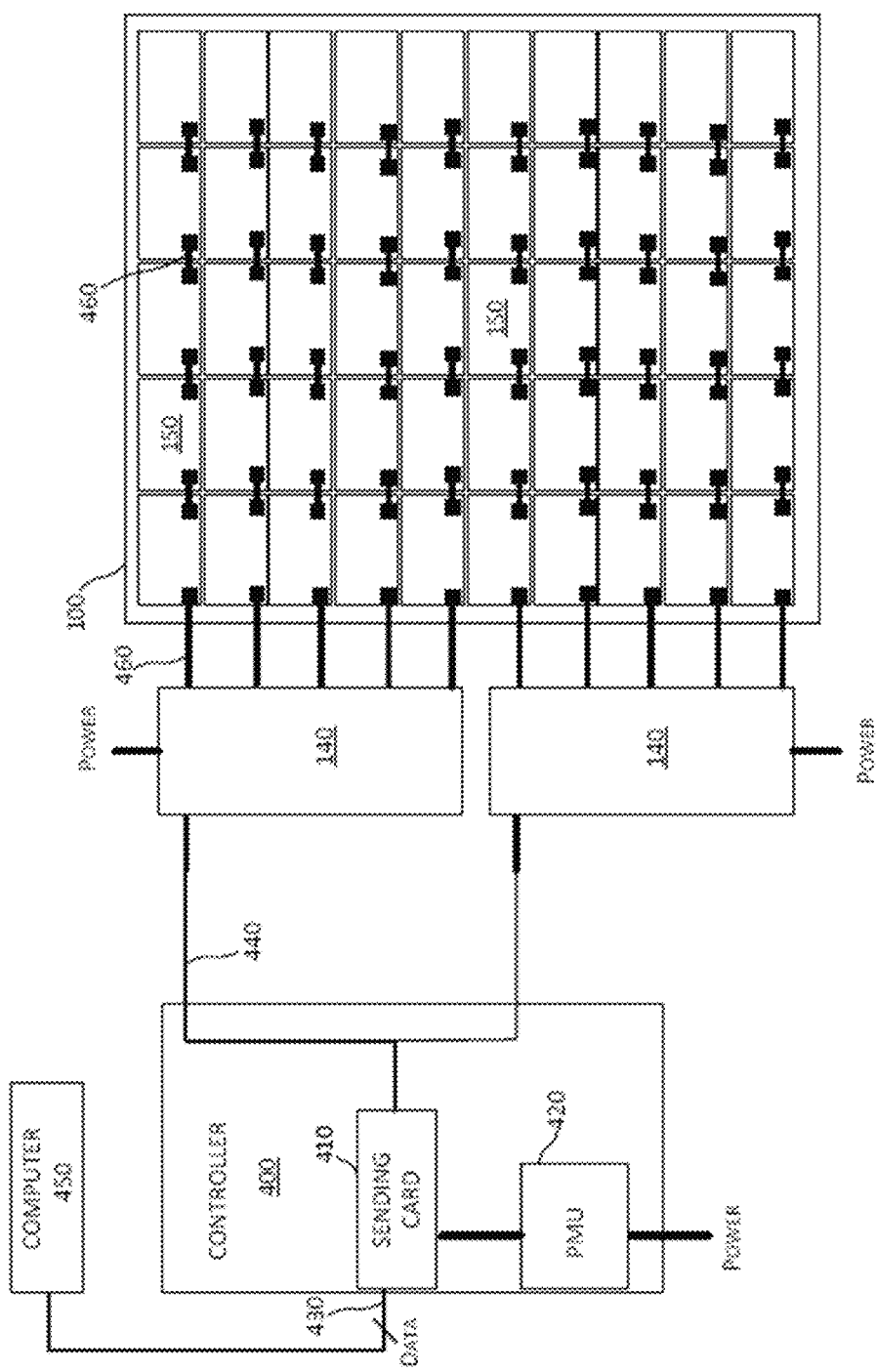
FIG. 4 illustrates an embodiment configuration for connecting LED panels to a video data source.

FIG. 4 illustrates an embodiment configuration for connecting LED display panels 150 to a video data source. Referring to FIG. 4, the LED display panels 150 are arranged in an array of rows and columns. Each LED display panel 150 of each row is electrically connected to an adjacent LED display panel 150 within that row. Each LED display panel is also electrically connected to a data source and to a power source. In various embodiments, a receiver unit 140 is mounted to the mechanical support structure or frame no. The receiver unit 140 is configured to receive data from a controller 400 and to provide power, data, and communication to the LED display panels 150 through integrated power and data cables 460. The first cable 360 and the second cable 365 in FIG. 3A are specific applications of the integrated power and data cables 460 illustrated in FIG. 4.

The integrated power and data cable 460 includes wires for carrying data/control information and wires for carrying power. The data/control wires may include twisted pair. The length of the data and power wires may be controlled to provide signal propagation within each LED display panel within a specific time. The data/control wires may be configured to transport data at a high bit rate, e.g., at least 1 Mbit/s, and may be 100-1000 Mbit/s. To minimize noise, the cable as a whole may be shielded or the data/control wires or twisted pairs of data/control wires may be shielded separately. In some embodiments, the power connections to the power wires can be configured so that power is run across all of a row (or any other group of panels). In this manner, if the power supply of any one of the panels fails, the other panels will continue to operate. In some embodiments, a first LED display panel in each row may be electrically coupled to the receiver unit 140. The other LED display panels in each row may be daisy-chain coupled to an adjacent LED display panel.

A controller 400 may be connected to the receiver unit through a data network 440 that is a wired or wireless network. Data to be displayed at the multi-panel display system may be first received from a computer 450, which may be a media server, at a controller 400. The controller 400, which may also be part of the media server, may transmit the data to be displayed to one or more receiver units 140. A very large display may include more than one receiver units 140. The receiver units 140 receive the data to be displayed from the controller 400, and distribute it across to the multiple display panels.

The controller 400 may be remotely located or located on-site in various embodiments. The controller 400 is configured to provide data to display to the receiver unit 140. The output of the controller 400 may be coupled through a network cable or WLAN to the receiver unit 140. Alternatively, the output of the controller 400 may be coupled to an ingress router of the internet and the receiver unit 140 may be coupled to an egress router if the controller 400 is located remotely.

The receiver unit 140 connects the LED display panels with data to be displayed on the integrated display and with power to power each of the LED display panels 150. In one or more embodiments, the receiver unit 140 creates multiple outputs, where each output is configured for each panel under its control. Alternatively, the LED display panels 150 may be configured to decode the received data and select and display only the appropriate data intended to be displayed by that particular LED display panel 150. The receiver unit 140 may transmit the media or data to be displayed in a suitable encoded format.

In one or more embodiments, the receiver unit 140 transmits analog video. For example, in one embodiment, composite video may be outputted by the receiver unit 140. In a second embodiment, luminance-blue-difference-red-difference (YCBCR) analog component video may be outputted by the receiver unit 140. In a third embodiment, luminance-chrominance (YC) encoded analog video may be outputted by the receiver unit 140. In a fourth embodiment, red-green-blue (RGB) analog video may be outputted by the receiver unit 140. In other embodiments, the output video of receiver unit 140 comprises video to be displayed encoded in a digital video format (e.g., 4:4:4 $YC_BC_R$, 4:2:2 $YC_BC_R$, 4:4:4 RGB, 4:2:2 RGB, etc.) by each of the display panels under the receiver unit 140.

Figure 5B:
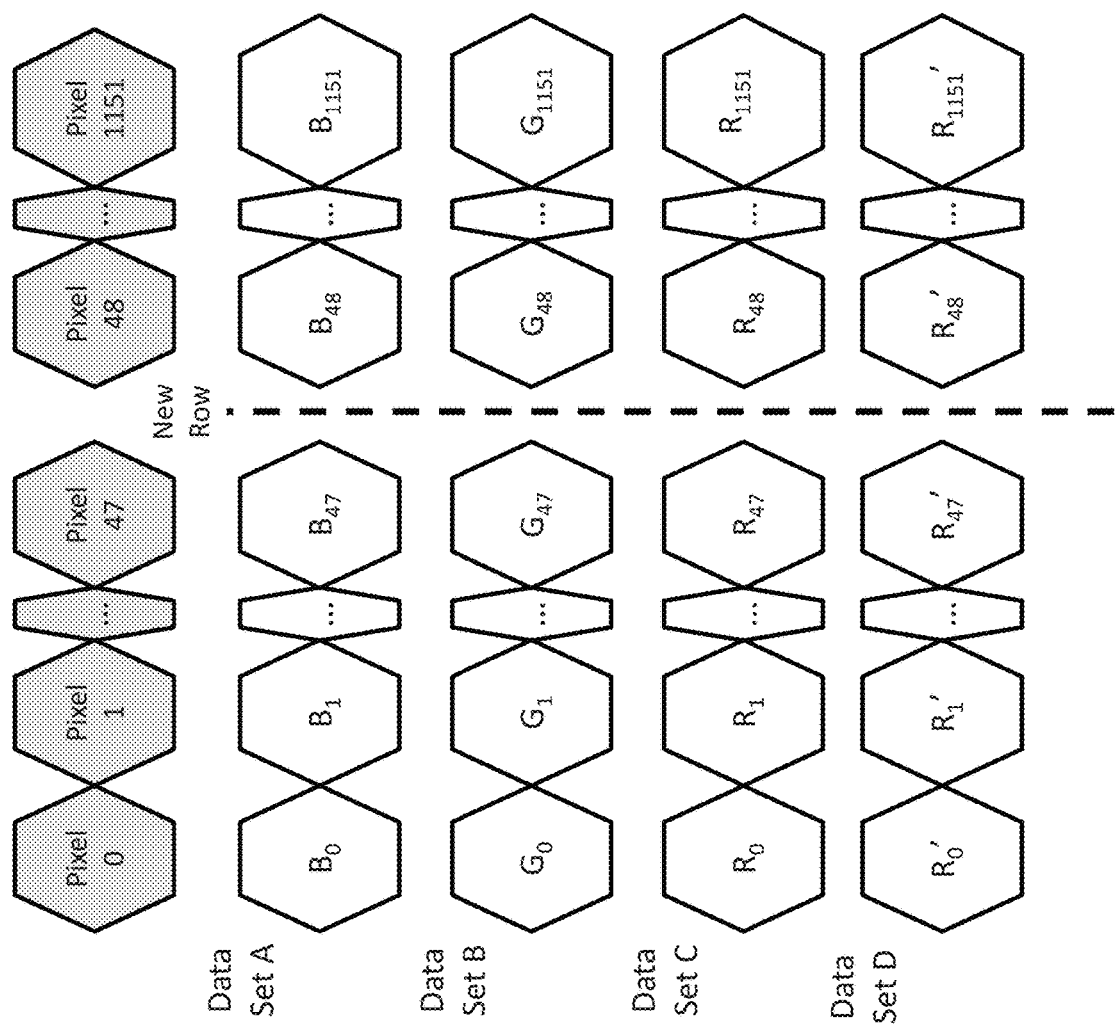
Figure 5D:
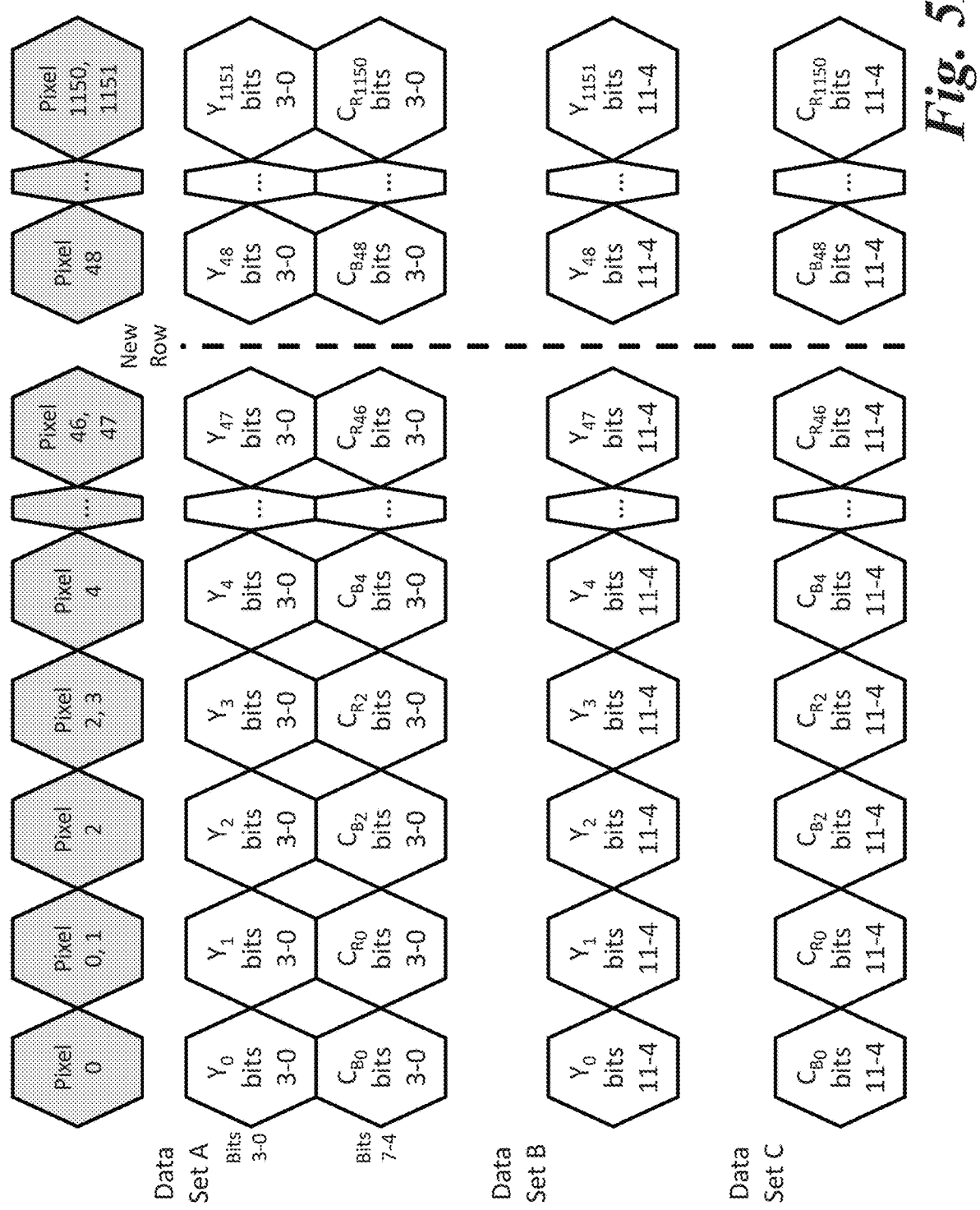
Figure 5E:
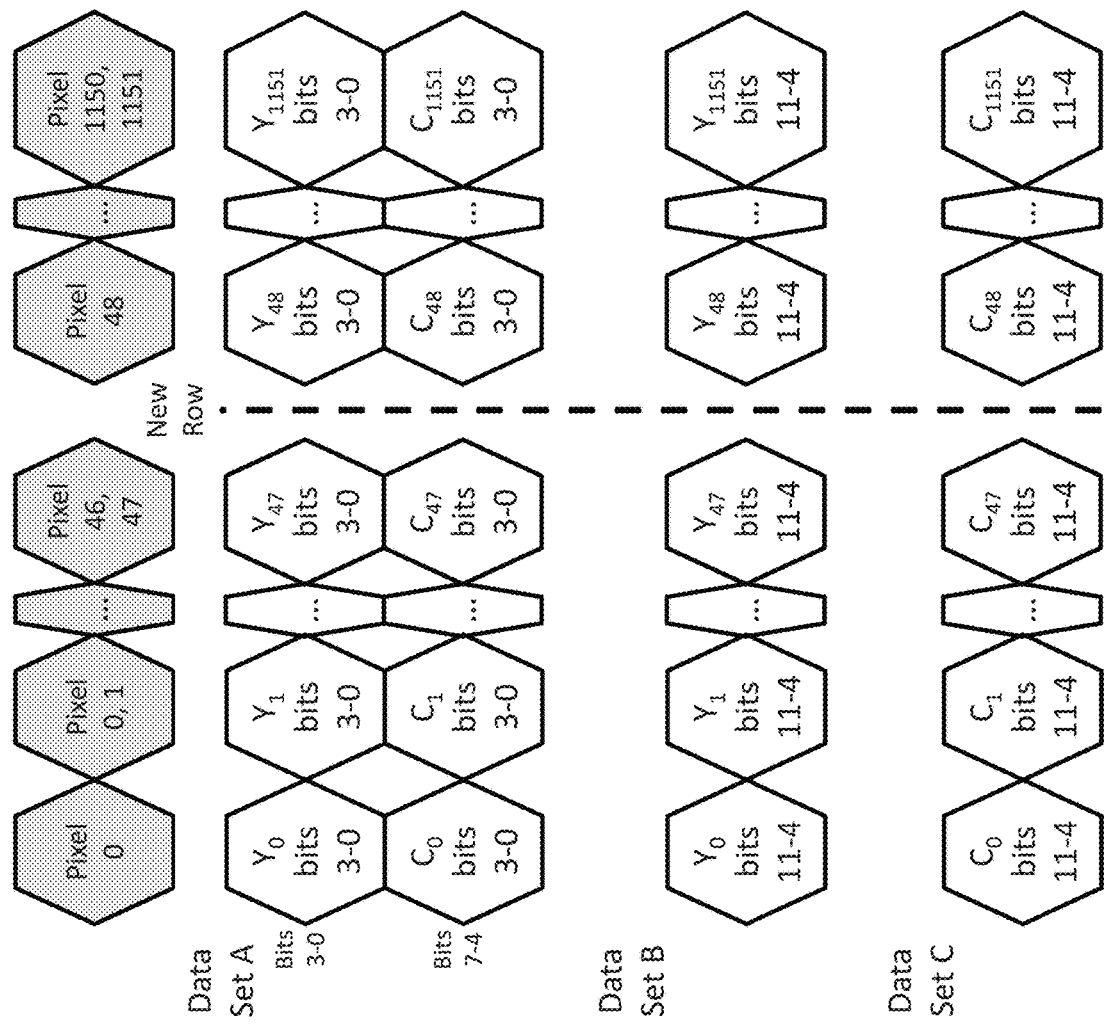
Figure 5F:
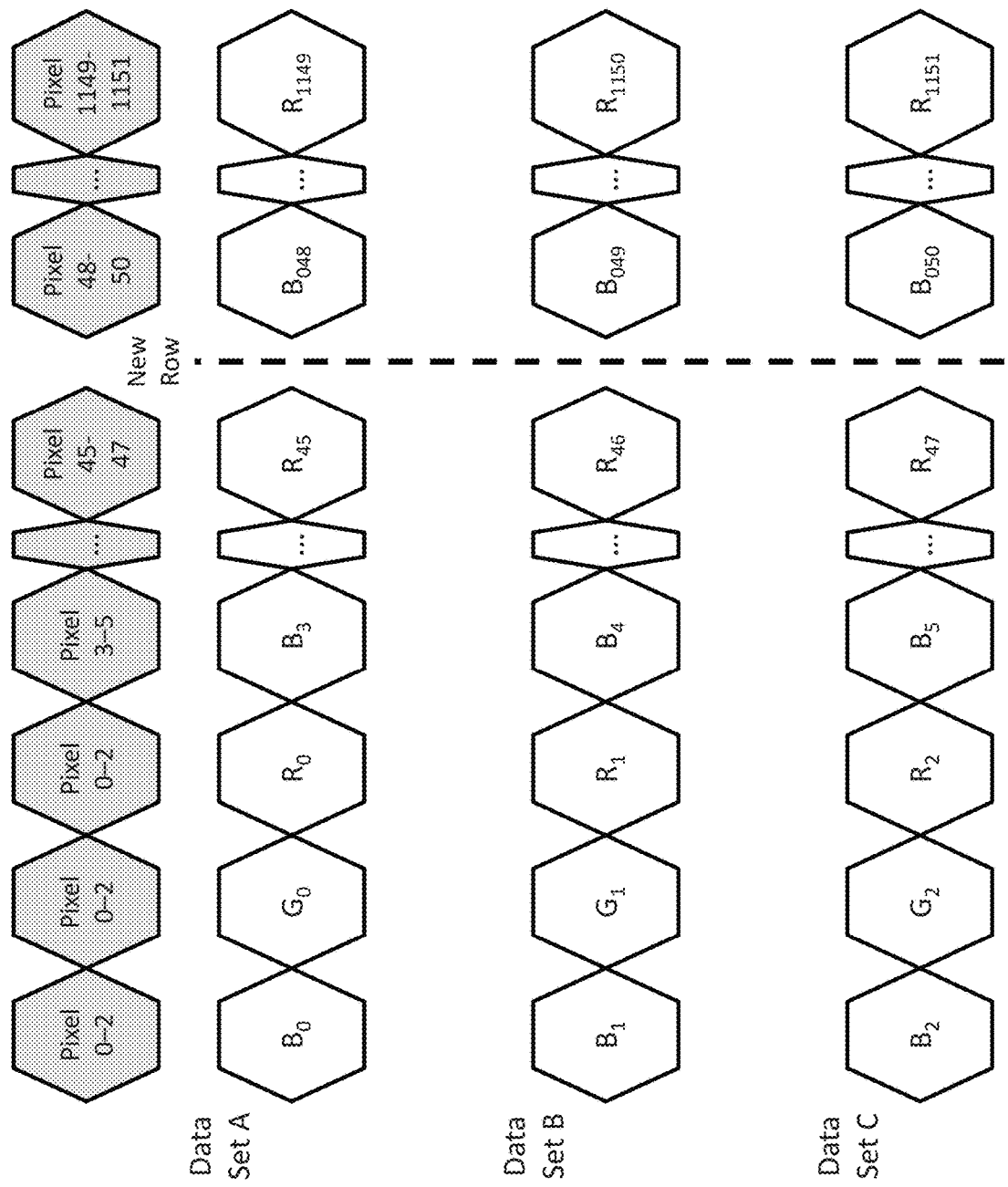

FIG. 5, which includes FIGS. 5A-5G, illustrates embodiment formats for digitally storing video data in video memory buffers of LED panels after the data has been transmitted by the receiver unit. FIG. 5A illustrates digital storage of RGB component data stored in three data sets in accordance with a 4:4:4 sampling ratio after the data has, for example, been transmitted across three channels or has been serially multiplexed on a single transmission channel from the receiver unit. FIG. 5B illustrates digital storage of RGB component data stored in four data sets in accordance with a 4:2:2 sampling ratio. FIG. 5C illustrates digital storage of $YC_BC_R$ component data in three data sets in accordance with a 4:4:4 sampling ratio. FIG. 5D illustrates digital storage of $YC_BC_R$ component data in three data sets in accordance with a 4:2:2 sampling ratio. FIG. 5E illustrates digital storage of YC data in three data sets. FIG. 5F illustrates digital storage of RGB data that is divided into three data sets in accordance with a pixel-by-pixel distribution.

FIG. 5A illustrates an embodiment frame of video data distributed in three data sets in accordance with a 4:4:4 RGB component 24-bit format. In other embodiments, different numbers of data sets and memory locations could be used. This exemplary frame contains 1152 pixels organized into 24 horizontal lines or rows of 48 pixels each, which corresponds to a 1'×2' display panel with a pitch of 12.7 mm between pixels. Other frame sizes would be used for other embodiment panels having differing numbers of pixels. In this embodiment, data set A contains pixel components of 8 bits representing the blue component of each pixel. 8 bits is the word size of this embodiment. In other embodiments, different word sizes may be used. As an example, $B_o$ is 8 bits of data storing the blue pixel value of the first pixel in the first line. A first group of 48 pixel blue components of 8 bits each precede a first new row divider. In an embodiment, this new row divider is a horizontal synchronization (HSYNC) symbol included in the data stream to demarcate the end of a horizontal line of data to be displayed. In other embodiments, the new row divider of FIG. 5A indicates that preceding pixels are stored in a different portion of memory than those pixels that follow the new row divider. This division into different areas of memory may be accomplished by, for example, sizing each memory partition to hold only the data necessary for a single row of pixels. Alternatively, a new row could be indicated by a control signal provided by the receiver unit to the panel to demarcate the end of a horizontal line of data to be displayed. The stored data contains each new row of data in subsequent groups of 48 blue components up to the end of the frame, which contains a total of 1152 8-bit blue components corresponding to the 1152 pixels in the frame. Similarly, data set B is divided into a new row after every 48 8-bit red pixel components in a set of 1152 red components, and data set C is a third digital data set is divided into a new row after every 48 8-bit green pixel components in a set of 1152 green components. In an embodiment, current driver 353 of FIG. 3B may use these RGB components in data sets A, B, and C to drive LEDs in an embodiment display panel having a 12.7 millimeter pitch.

FIG. 5B illustrates an embodiment frame of video data distributed over four digital memory locations of the buffer video memory 355 of FIG. 3B in accordance with a 4:2:2 RGB component 32-bit format. The difference between this embodiment and the embodiment of FIG. 5A is that 16 bits representing the red component of each pixel are included in the stored data, with 8 bits being provided by the R data in data set C and an additional 8 bits provided by the R' data in data set D.

FIG. 5C illustrates an embodiment frame of video data distributed over three digital memory locations of buffer video memory 355 in accordance with a 4:4:4 $YC_BC_R$ component 24-bit format. The difference between this embodiment and the embodiment of FIG. 5A is that data set A contains blue difference data in 8-bit pixel components, data set B contains luminance data in 8-bit pixel components, and data set C contains red difference data in 8-bit pixel components.

FIG. 5D illustrates an embodiment frame of video data distributed over three digital memory locations of buffer video memory 355 in accordance with a 4:2:2 $YC_BC_R$ component 24-bit format. The difference between this embodiment and the embodiment of FIG. 5C is that data set A contains 8-bit pixel components comprised of 4 bits representing the luminance component of each pixel and 4 bits representing either the blue-difference or red-difference component of each alternating pixel.

FIG. 5E illustrates an embodiment frame of equally sampled 24-bit YC video data distributed over three digital memory locations of buffer video memory 355. The difference between this embodiment and the embodiment of FIG. 5D is that blue difference and red difference data are replaced by 12-bit chrominance data, four bits of which are stored in each 8-bit pixel component of data set A, and eight bits of which are stored in each 8-bit pixel component of data set C.

FIG. 5F illustrates an embodiment frame of 4:4:4 24-bit RGB video data distributed over three digital memory locations of buffer video memory 355 in accordance with a pixel-by-pixel distribution. The difference between this embodiment and the embodiment of FIG. 5A is that the number of pixels in a video frame is divided between the three data sets so that, for example, all the component data for a given pixel could be stored in the same form in which it is transmitted over the same serial data channel. In this embodiment, each data set contains all components for a third of the pixels in a video frame, with the pixels assigned to each data set alternating with each pixel.

Figure 5G:
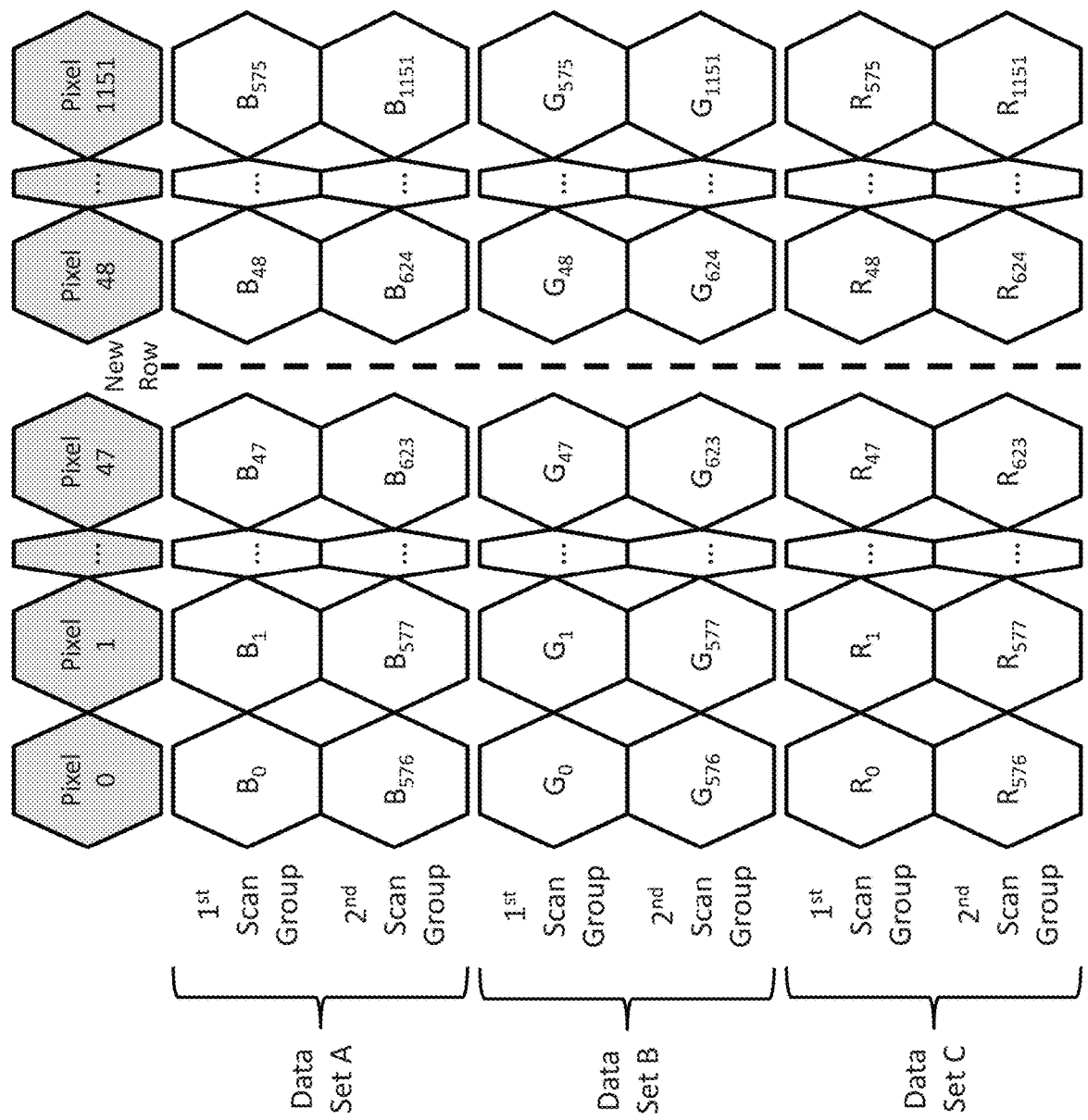

FIG. 5G illustrates an embodiment frame of 4:4:4 24-bit RGB data distributed over three data channels in accordance with a scanning pattern. The difference between this embodiment and the embodiment of FIG. 5A is that each data set is divided among two scan groups. During a first scanning period, the data in the first scan group of data sets A-C is digitally stored. During a second scanning period, the data in the second scan group of data sets A-C is digitally stored, overwriting the data in the first scan group. Storage of data continues in alternating scanning periods as each video frame is received and digitally stored in buffer video memory 355.

Figure 6A:
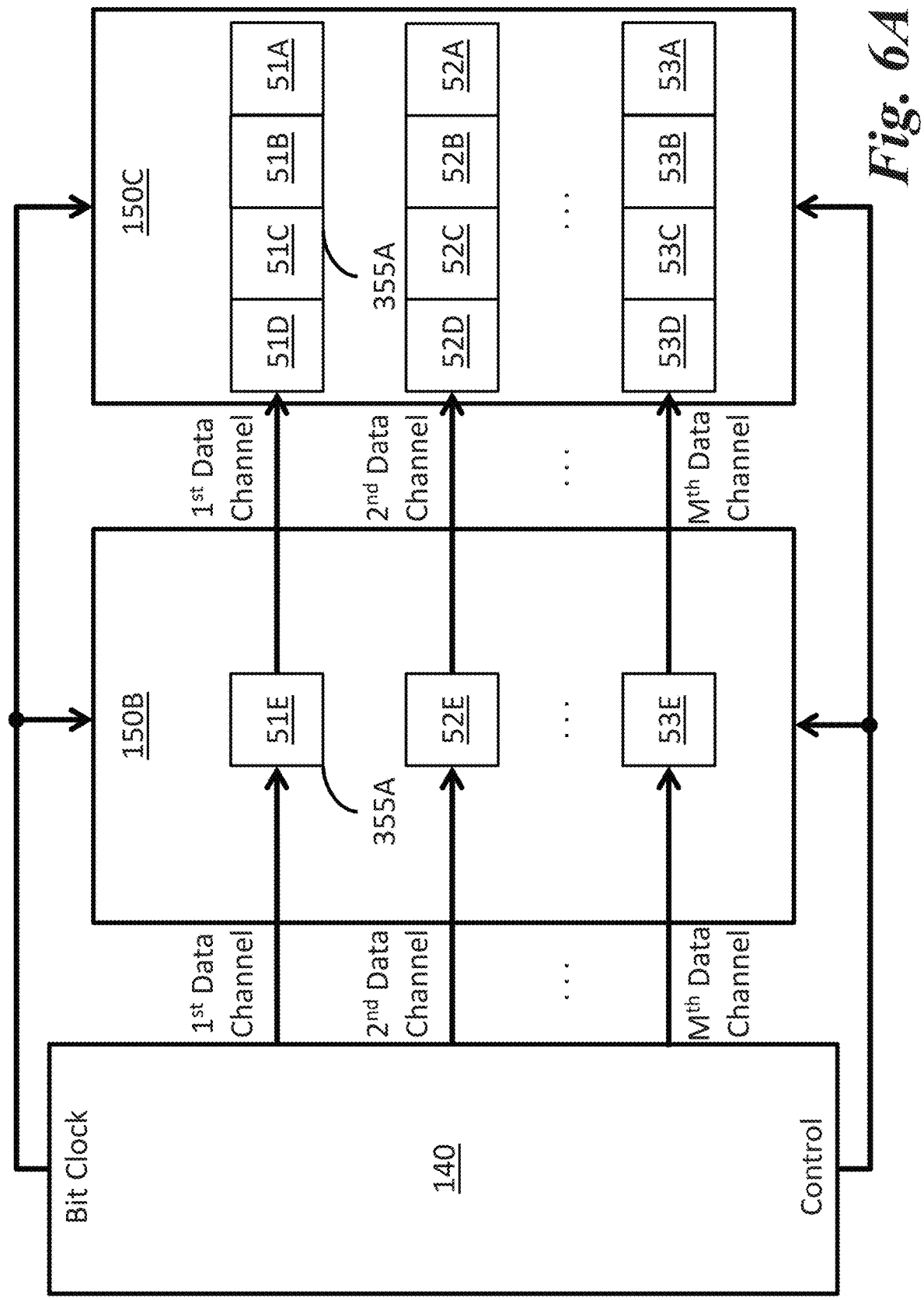
Figure 6B:
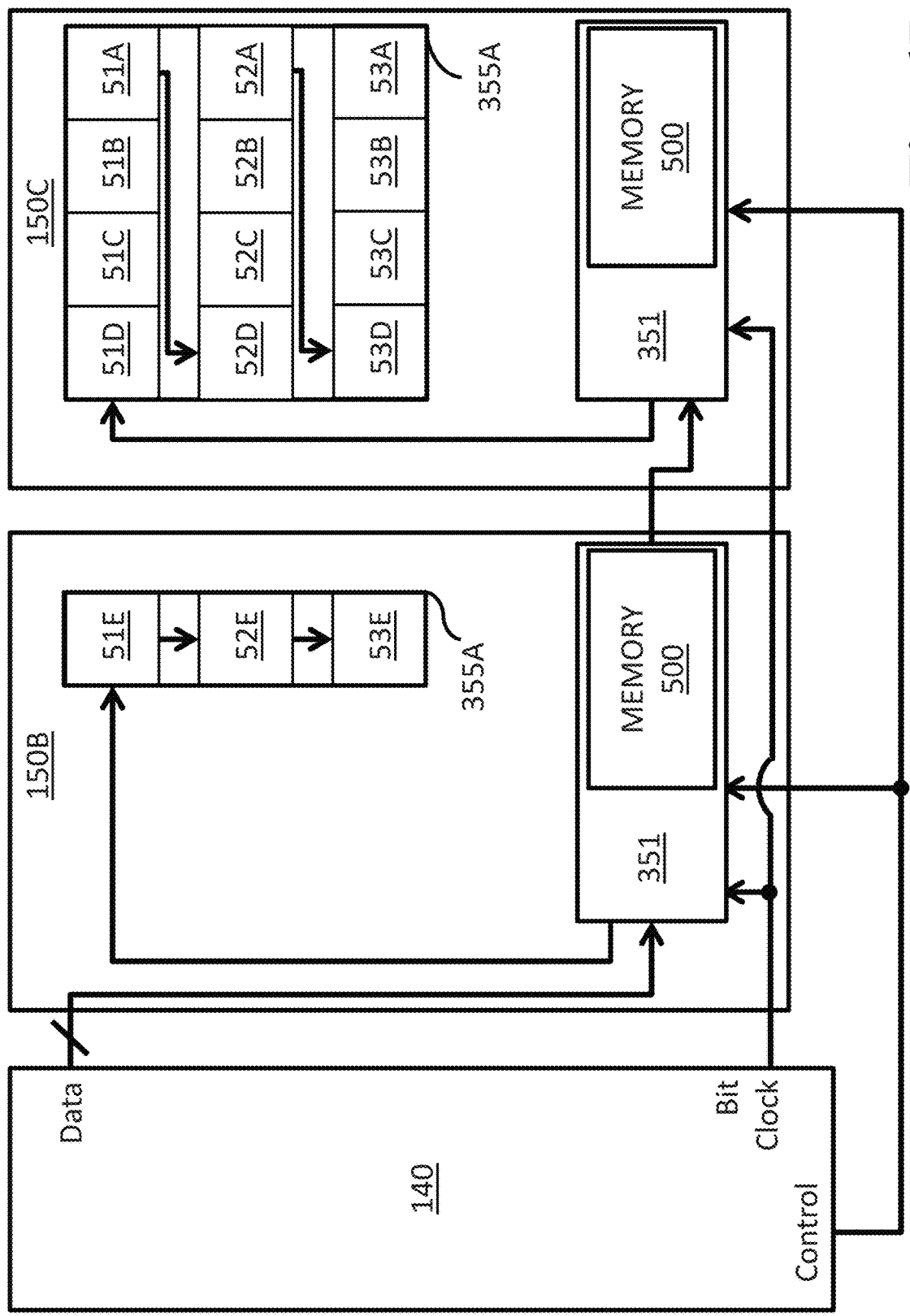
Figure 6C:
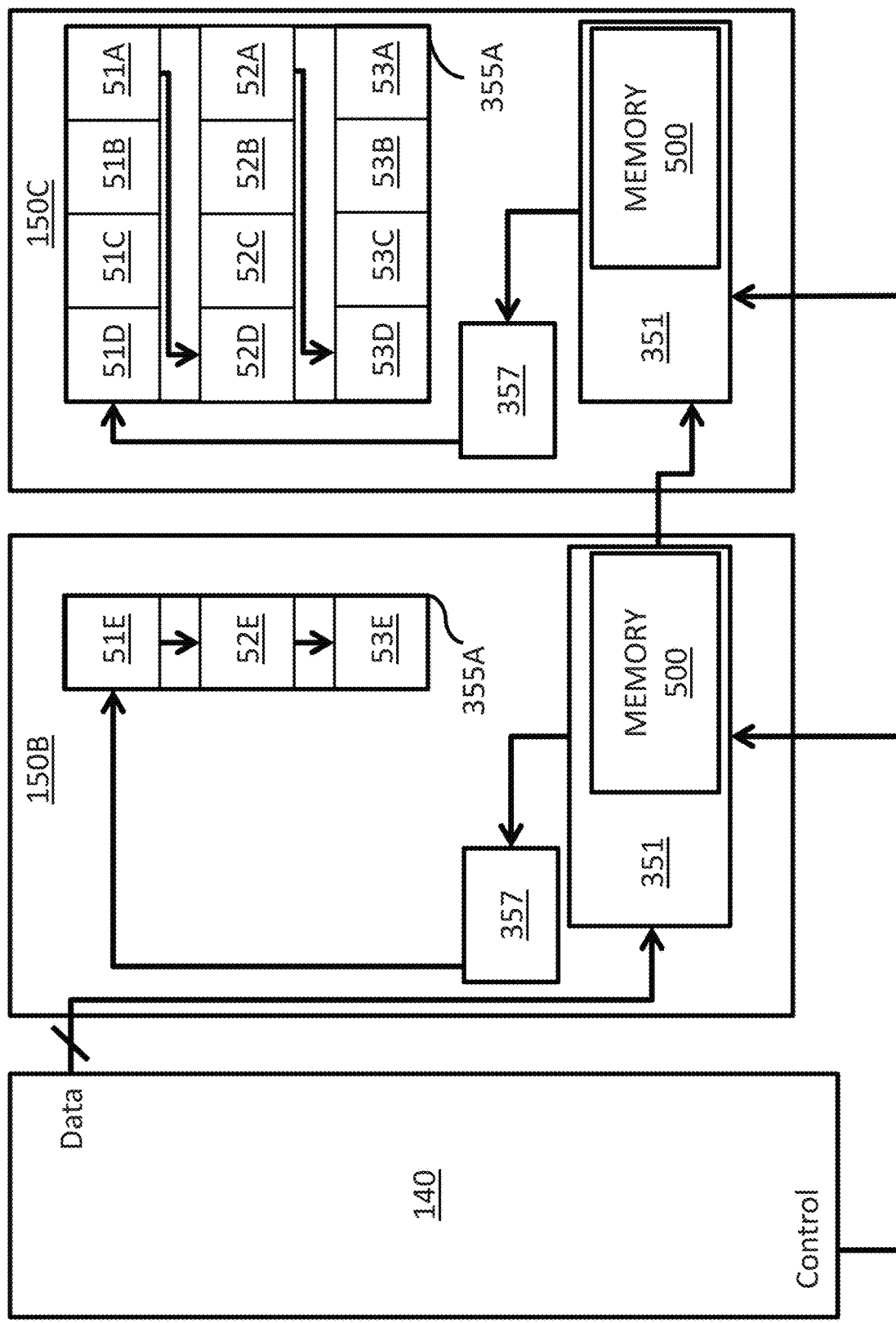

FIG. 6, which includes FIGS. 6A-6E, illustrates embodiment signaling configurations for transmitting data from the receiver unit to LED panels of different resolutions. FIG. 6A illustrates transmitting digital video data using a data-shifting daisy-chain configuration. FIG. 6B illustrates transmitting identifiably assigned digital video data using a pre-configured daisy-chain configuration. FIG. 6C illustrates transmitting identifiably assigned analog video data using a pre-configured daisy-chain configuration. FIG. 6D illustrates transmitting identifiably assigned digital video data in a dynamically adaptable daisy-chain configuration. FIG. 6E illustrates transmitting multiplexed digital video data using a data-shifting daisy-chain configuration.

FIG. 6A illustrates an embodiment transmitting serial digital video data to panels of different resolutions using a data-shifting daisy-chain configuration. The receiver unit 140 is pre-configured to know information about panels 150B-C, including the panels' resolutions, and pixel counts/local video frame sizes. A global video frame for collective display across embodiment panels 150B and 150C is divided into two local video frames. A first local video frame is divided into data sets 51E, 52E, and 53E that are stored in panel 150B. A variable number of data transmission channels M may be used. In this embodiment, when 3 data channels are used, panel 150B has 1,152 pixels organized into 24 horizontal lines of 48 pixels each, which could be implemented in, for example, a 1'×2' display panel with a pitch of 12.7 mm between pixels. A second local video frame is divided into data sets 51A-51D, 52A-52D, and 53A-53D that are stored in panel 150C. In this embodiment, when 3 data channels are used, panel 150C has 4608 pixels organized into 48 horizontal lines of 96 pixels each, which could be implemented in a 1'×2' display panel with a pitch of 6.35 mm between pixels. Different panel sizes and resolutions may be used in other embodiments.

In embodiments of the present invention, any of the formats of FIGS. 5A-5G may be used for the data sets 51A-E, 52A-E, and 53A-E that are respectively divided for transmission into M data channels and optionally into multiple scan groups and are then buffered into video memory in panels 150B and 150C. In other embodiments, other digital data storage formats may be used. In FIG. 6A, the video memories of panels 150B and 150C are implemented as shift registers 355A. When three data channels are used to transmit, for example, 4:4:4 RGB component video, blue pixel components could be transmitted in the first data channel, green components could be transmitted in the second data channel, and red components could be transmitted in the third data channel, so that buffered data sets 51A-51D collectively could represent the blue component of a 4,608 pixel local video frame, buffered data set 51E could represent the blue component of an 1152 pixel local video frame, and buffered data sets 52A-52E and 53A-53E could respectively represent the green and red components of these two frames. When more than three data channels are present, the data could be divided into smaller bit amounts in each channel than the 4 or 8-bit groups depicted in the data sets of FIGS. 5A-5G. In other embodiments, any number of data channels could divide up the number of pixels in a video frame in accordance with the data set formatting depicted in FIG. 5F-5G.

In FIG. 6A, data set 51A is sent serially across the first data channel between the receiver unit 140 and panel 150B in accordance with a bit clock, until a first location in one of the shift registers 355A of panel 150B is full. Then data set 51B is sent serially across the first data channel between receiver unit 140 and panel 150B, and each bit of data set 51A is shifted into the shift registers 355A of panel 150C as each bit of data set 51B is received by panel 150B. Transmission of data sets 51C-51E continues until data sets 51A-51D are completely shifted into the shift registers 355A of panel 150C and data set 51E is stored in the shift registers 355A of 150B. In the same way, data sets 52A-52E and 53A-53E are sent serially by receiver unit 140 to panel 150B, with data sets 52A-52D and 53A-53D then shifted into the shift registers 355A of panel 150C so that only the local video frame for panel 150B comprising data sets 51E, 52E, and 53E continues to be stored in the shift registers in panel 150B. At this time, the local video frame for panel 150C comprising data sets 51A-51D, 52A-52D, and 53A-53D is stored in panel 150C.

A frame clock, latch signal, or other control signal provided by the receiver unit 140 may signal panels 150B and 150C to display the local video frames stored in their buffer memories. In an embodiment, HSYNC data is transmitted serially with pixel data. In other embodiments, new rows in the data are indicated by an HSYNC signal, latch signal, or other control signal provided by the receiver unit 140. In an embodiment, multi-pin connections can be used to support signaling in the channels between the receiver unit 140 and the panels 150B and 150C. An exemplary 16-pin connection includes a latch pin, a clock pin, five address pins, an enable pin, three data pins, a signaling voltage pin, a signaling ground pin, a power supply pin, a power return pin, and a power ground pin. More or fewer pins may be provided for any of the foregoing pin types, and not all pin types may be provided in a multi-pin connection.

FIG. 6B illustrates transmitting identifiably assigned digital video data using a pre-configured daisy-chain configuration. The difference between this embodiment and the embodiment of FIG. 6A is that video data is sent in segments/packets over one or more data channels using a multiple access technique such as packet addressing or time division multiplexing such that the destination panel assigned to each segment is identifiable. In an embodiment, before receiver unit 140 begins sending data, it initializes panels 150B and 150C using a control channel by providing the interface circuits 351 of both panels with a unique address, time slot number (TSN), or other identifying information, which each interface circuit stores in a memory 500. A video frame destined for one of the panels is divided into one or more video segments. In an embodiment, a destination address is inserted by receiver unit 140 into the data stream as a header to the video segment. In other embodiments, a video segment intended for one of panels 150B and 150C is inserted by receiver unit 140 into a time slot in the data stream in accordance with a TSN assigned to the destination panel. In other embodiments, the receiver unit 140 indicates using a control/address signal on the control channel to indicate which of panels 150B or 150C should be actively receiving data. Interface circuit 351 in panel 150B determines, in accordance with the control/address signal or the address or TSN stored in its memory 500, whether data being received is intended for panel 150B, or whether it should be forwarded to the interface circuit of panel 150C.

In an embodiment, different panels 150B and 150C may have a different refresh rate. For example, panel 150B may have a slower refresh rate than panel 150C. The identifying information provided to panel 150B can notify it that inbound data from the receiver unit 140 is not intended to refresh panel 150B when panel 150B is not in its refresh period, in which case the inbound data will bypass the shift registers 355A of panel 150B. This bypassed data will then be delivered to panel 150C so that panel 150C may refresh its data in accordance with the higher refresh rate. For example, this may be used when panel 150B is intended to display text while panel 150C is intended to display high frame rate video such as sports or other action. By using multiple refresh rates, lower data rates may be used rather than having to send data to all panels at the refresh rate of the highest frame rate panel.

FIG. 6C illustrates transmitting assigned analog video data using a pre-configured daisy-chain configuration. The difference between this embodiment and the embodiment of FIG. 6B is that video data is sent in an analog form such as RGB component video, $YC_BC_R$ component video, composite video, S-video, etc., in assigned time slots such that the destination display panel can be determined by interface circuits 351 in accordance with the assigned TSN for each panel. Analog data arriving at one of the graphics processors 357 is converted to digital data that is stored in buffer video memory 355 in accordance with, for example, one of the digital storage formats of FIGS. 5A-5G.

FIG. 6D illustrates transmitting digital video data using a dynamically adaptable daisy-chain configuration. The difference between this embodiment and the embodiment of FIG. 6B is that panels 150B and 150C can be dynamically added to the configuration using a hot plug detect channel and a bi-directional control channel. When a panel 150C is added to the configuration, it sends a signal on the hot plug detect channel to notify receiver unit 140 of its existence. An initialization sequence is then performed over the control channel. Panel 150C sends the receiver unit 140 its resolution information. In embodiments of the invention, panel 150C or panel 150B determines a unique address for panel 150C in accordance with the address of existing panel 150B, and then sends this address to receiver unit 140 over the control channel. In other embodiments, receiver unit 140 assigns a unique address to panel 150C over the control channel, which the interface circuit 351 stores in memory 500. Interface circuit 351 in panel 150B determines in accordance with the stored address whether data being received is intended for panel 150B, or whether it should be forwarded to the interface circuit of panel 150C.

FIG. 6E illustrates transmitting row-multiplexed digital video data using a data-shifting daisy-chain configuration. The differences between this embodiment and the embodiment of FIG. 6A are that three data channels are used, another panel 150D is included in a daisy chain after panel 150C, data is divided by rows among different shift registers 355A, and a scanning pattern is used to reduce memory requirements of the panels. In this embodiment, the receiver unit 140 is pre-configured to know information about panels 150B-D, including the panels' resolutions, pixel counts/local video frame sizes, number of scan groups, refresh rates, and number of rows and columns of shift registers 355A of each scan group. A global video frame for collective display across embodiment panels 150B-150D is divided into three local video frames, which are each in turn divided into 24 scan groups. A first scan group of a first local video frame is divided into data sets 50, 52F, and 53F that is stored in panel 150B, which has 1,152 pixels organized into 24 horizontal lines of 48 pixels each and which could be implemented in, for example, a 1'×2' display panel with a pitch of 12.7 mm between pixels. A first scan group of a second local video frame is divided into data sets 51B-51E, 52B-52E, and 53B-53E that are stored in panel 150C, which has 4608 pixels organized into 48 horizontal lines of 96 pixels each. Panel 150C could be implemented in, for example, a 1'×2' display panel with a pitch of 6.35 mm between pixels. A first scan group of a third local video frame is divided into data sets 51A, 52A, and 53A that is stored in panel 150D, which has the same resolution and number of pixels as panel 150B. Different panel sizes and resolutions may be used in other embodiments.

In the embodiment of FIG. 6E, data set 51A is sent serially across the first data channel between the receiver unit 140 and panel 150B in accordance with a bit clock, until a first location in one of the shift registers 355A of panel 150B is full. Then data set 51B is sent serially across the first data channel between the receiver unit 140 and panel 150B, forcing data set 51A to pass through the demultiplexer 502 of panel 150C and into an active shift register in panel 150C. In accordance with either a control signal (such as an address signal) or with the position in the data stream of the data set, the active shift register is either the combined first (topmost) shift register of panel 150C—which is formed from two daisy-chained 48-position shift registers and corresponds to the Nth row of pixels in the panel's pixel array, or the combined second shift register—which corresponds to pixels on row N+24, with N being the active scanning period. Each combined shift register in panel 150C contains 96 positions that correspond to the 96 columns in the pixel array. Each scan group contains two rows, such as the first 96-position shift register and the second 96-position shift register. When the active shift register of panel 150C is full and additional data arrives at the active shift register, data set 51A is then shifted into the first shift register of panel 150D, passing through a demultiplexer included in the panel, for example, to support future changes in scanning pattern and shift register components. In this example, in accordance with the control signal the active shift register of panel 150C is the first shift register when data sets 51B-51C are shifted into panel 150C, and the active shift register is the second shift register when data sets 51D-51E are shifted into panel 150C.

Referring again to FIG. 6E, transmission of data sets 51C-50 continues until data set 51A is completely shifted into panel 150D, data sets 51B-51E are completely shifted into the shift registers 355A of panel 150C and data set 50 is stored in the first shift register of 150B. In the same way, data sets 52A and 53A are sent serially by receiver unit 140 to panel 150D, data sets 52B-52E and 53B-53E are sent to panel 150C, and data sets 52F and 53F are sent by the receiver unit 140 to panel 150B. In an embodiment, a scanning clock, latch signal, pre-configured, or other control signal provided by the receiver unit 140 may then signal panels 150B-150D to display the scanning frames stored in their video memories. In other embodiments, the scanning frames are displayed in accordance with a timer.

Referring again to FIG. 6E, during scanning period N, panel 150C illuminates the first and $25^{th}$ row of pixels in its pixel array and panels 150B and 150D illuminate their first row of pixels in accordance with the data stored in video memory. During 23 subsequent scanning periods, additional data is shifted into panels 150B-150D, which then in accordance with the scanning period sequentially illuminate 23 other linked scan groups made up of pixel rows of the LED display. In other embodiments, any number of scanning periods may be used. The scanning period is indicated by, for example, a scan select signal, a scanning timer, or an address select signal sent by receiver unit 140.

Figure 7A:
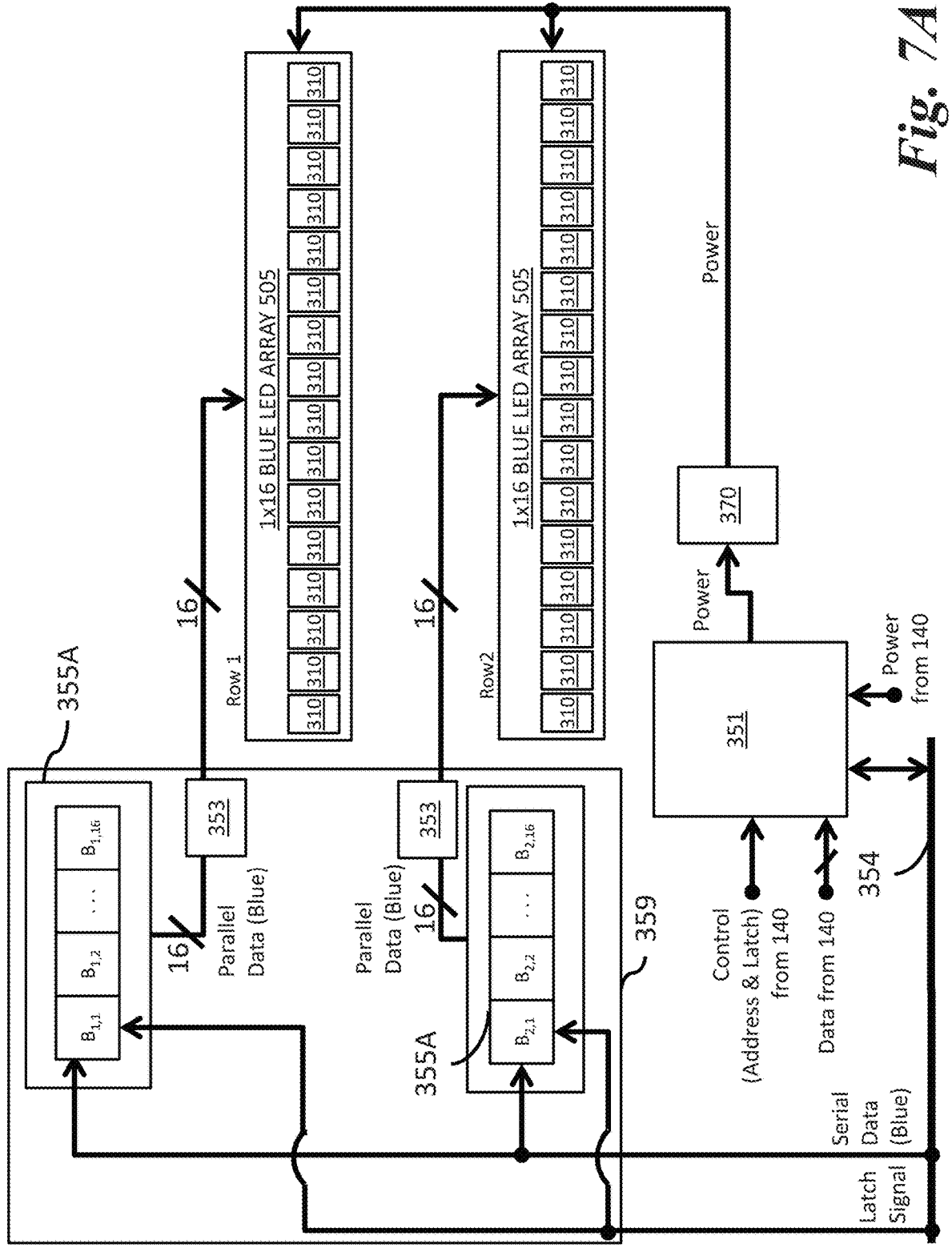
FIGS. 7A-7E, illustrates embodiment panel circuitry for implementing the signaling configurations of FIG. 6.
Figure 7B:
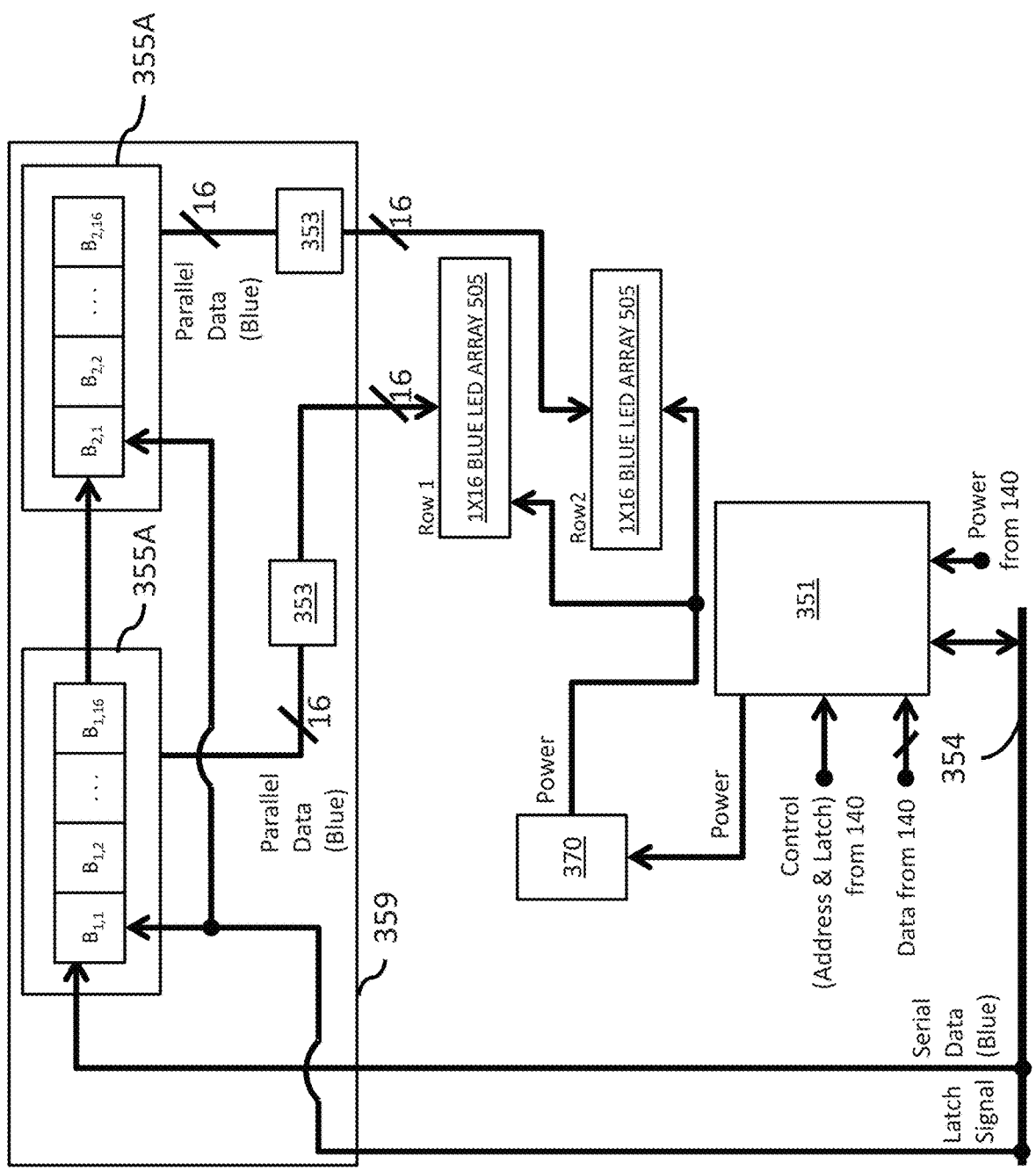
Figure 7C:
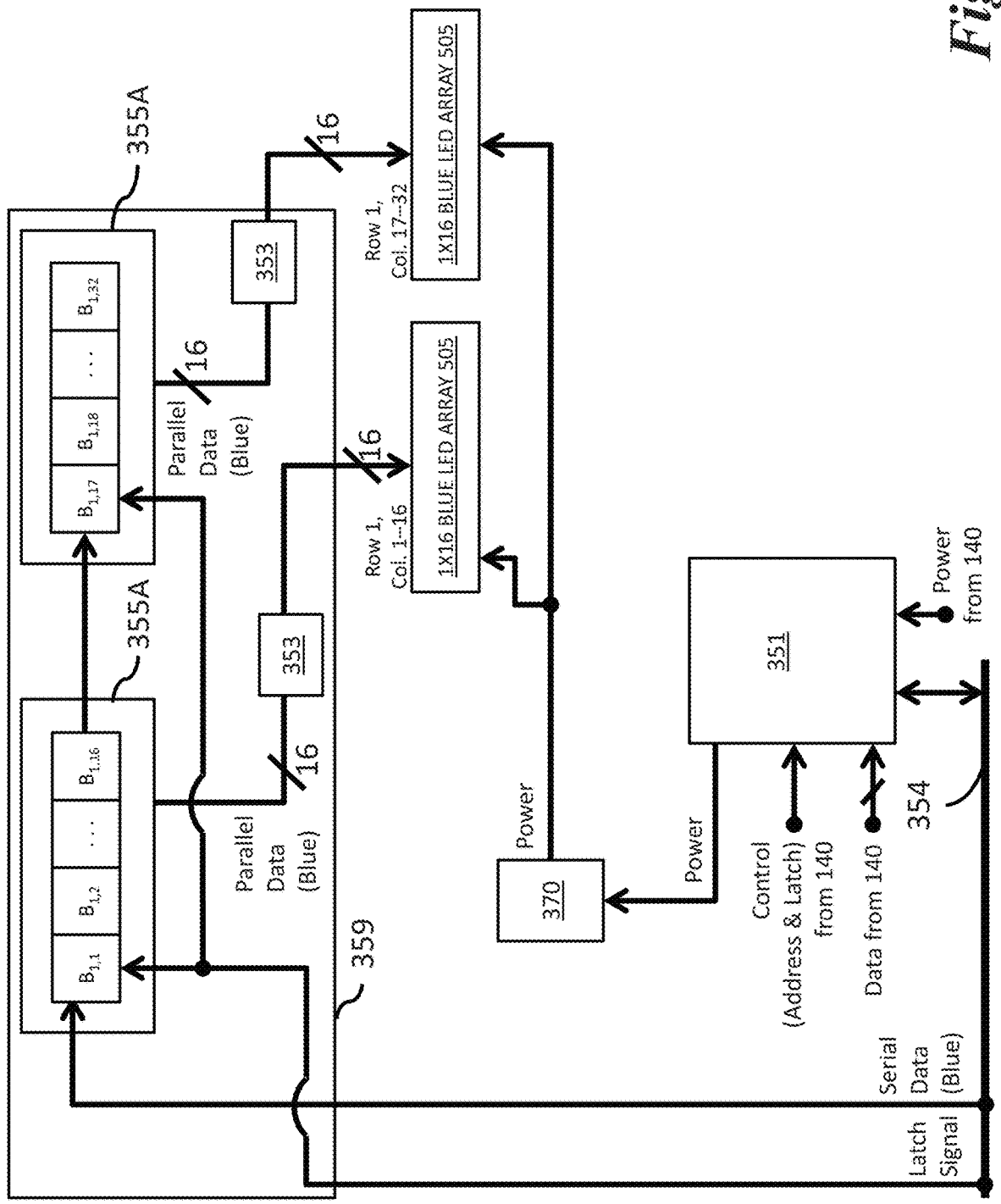
Figure 7D:
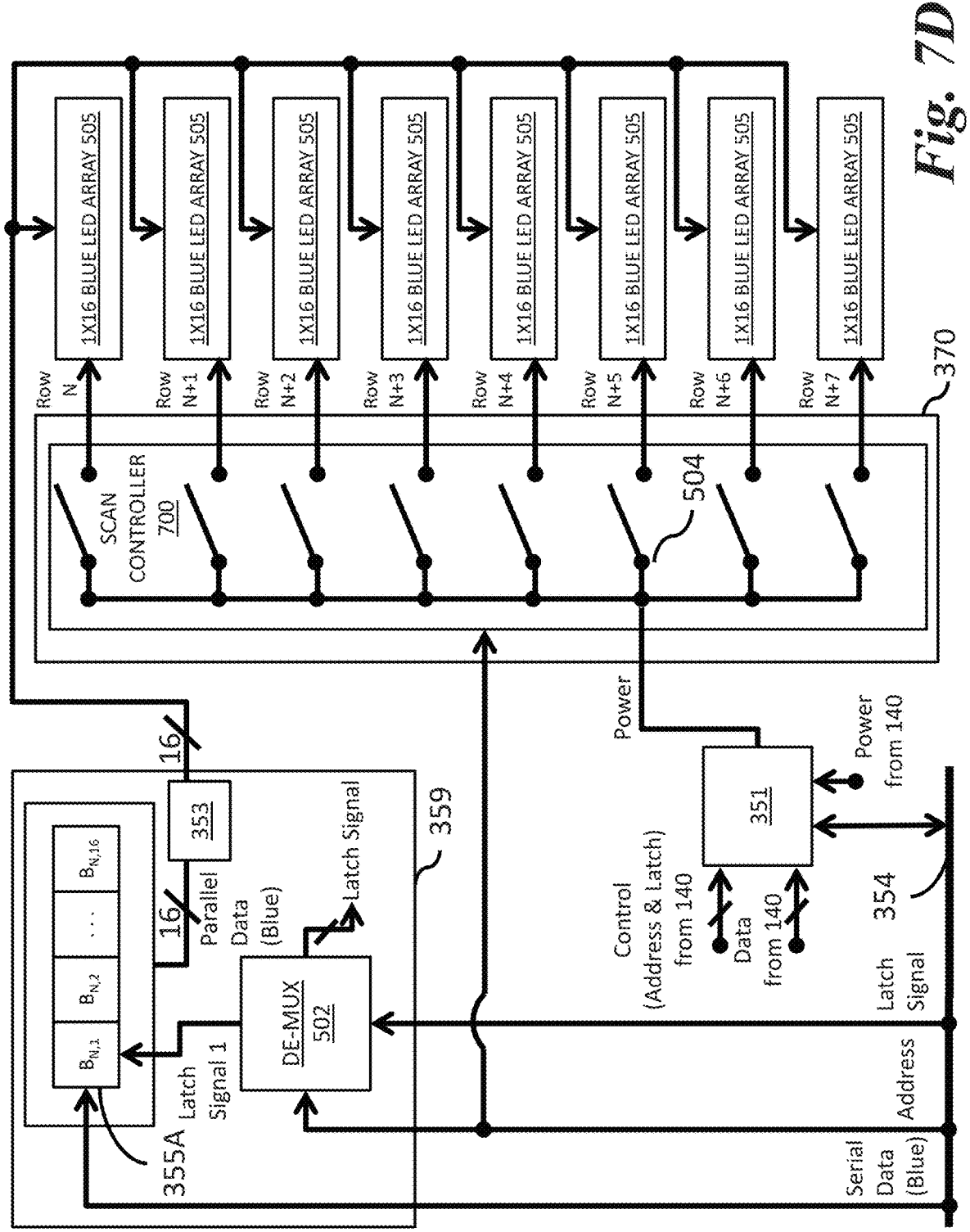
Figure 7E:
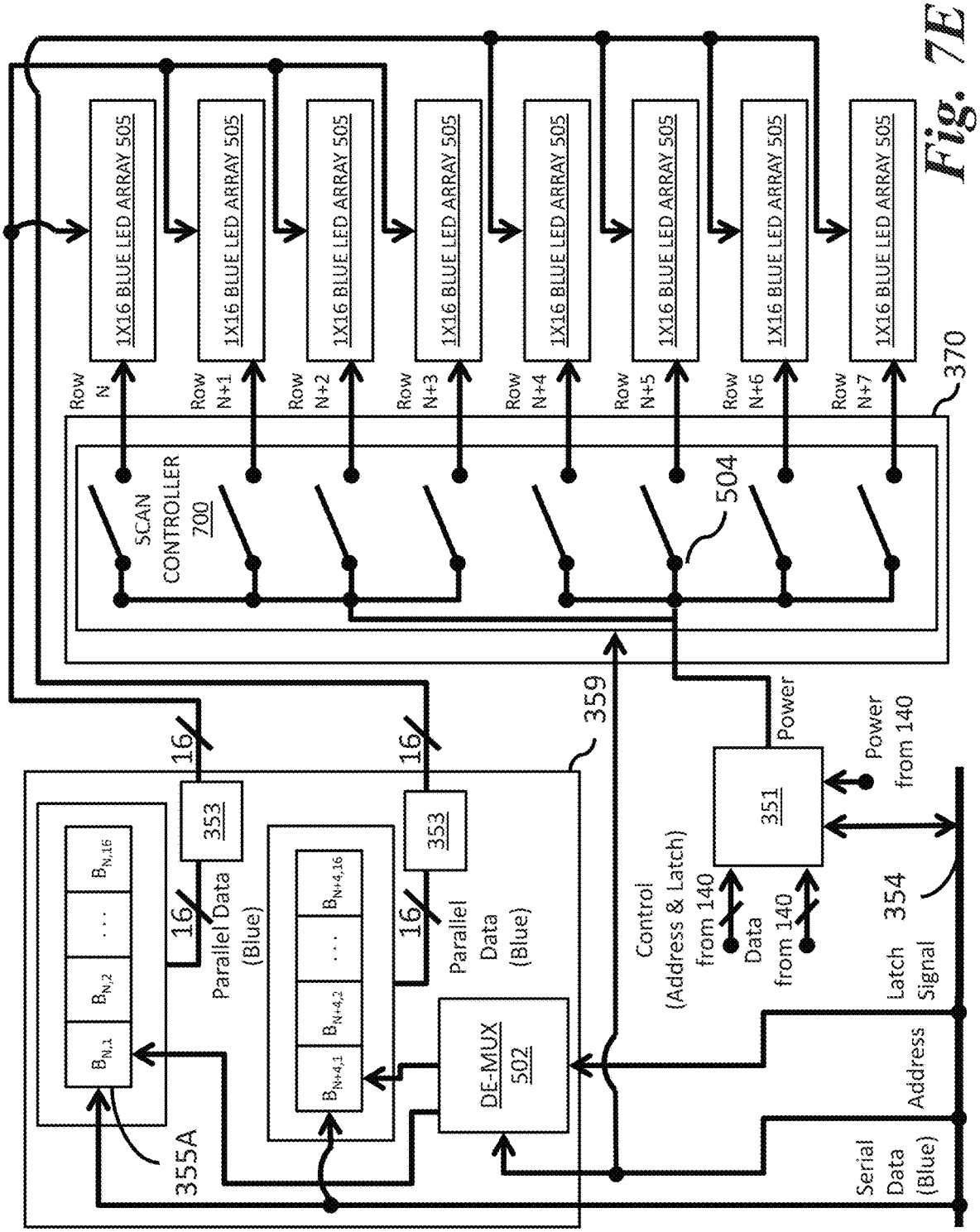

FIG. 7, which includes FIGS. 7A-7E, illustrates embodiment panel circuit diagrams implementing the signaling configurations of FIG. 6. FIG. 7A illustrates a panel with two shift registers coupled in parallel through two current drivers to two rows of pixels. FIG. 7B illustrates two shift registers coupled together to form a long shift register providing parallel data for two rows of pixels. FIG. 7C illustrates two shift registers coupled together to form a long shift register providing data for a single row of pixels. FIG. 7D illustrates a shift register coupled to a scan controller to provide data for multiple rows of pixels in accordance with a scanning pattern. FIG. 7E illustrates two shift registers coupled to a demultiplexer and to a scan controller to provide data for multiple rows of pixels in accordance with a scanning pattern.

Referring to FIG. 7A, only blue data driving blue LEDs is shown for illustrative purposes. In an embodiment, red and green data would drive red LEDs and green LEDs, which are not shown. In other embodiments, red, green, and blue data would drive different input pins of tri-colored LEDs. In FIG. 7A, data, power, and control signaling (including, for example address and latch signaling) is received at an interface circuit 351 of one of the panels. Power is then supplied to the power supply unit 370, which then powers two rows that are 1×16 LED arrays 505 of blue LEDs. Blue data is shifted serially from the interface circuit to the shift registers 355A of LED controller 359. This data is shifted through a data bus 354. In other embodiments, individual data wires take the place of the data bus 354. The blue data is shifted in accordance with a latch or clock signal provided to the shift registers 355A. As the shift registers 355A fill with stored digital data words in their 16 data word positions, they provide this data on 16 parallel outputs to current drivers 353. In accordance with a current driver synchronization signal (not shown), which may be derived from a clock or latch signal provided by the receiver unit 140 to interface circuit 351, the current drivers 353 then act as current sinks to control the current or duty cycle of the two rows of 16 LEDs each in LED arrays 505. Other embodiments may use current drivers as current sources, and may use shift registers of various sizes.

Referring to FIG. 7B, the difference between this embodiment and the embodiment of FIG. 7A is that two shift registers 355A are coupled together to from a single long shift register. In FIG. 7B, 32 words of digital data must be stored in this combined shift register before data is provided on 32 parallel outputs to current drivers 353, which then control the current or duty cycle of the two rows of 16 LEDs each in LED arrays 505.

Referring to FIG. 7C, the difference between this embodiment and the embodiment of FIG. 7B is that the two 16-LED arrays 505 are configured to form a single row of 32 LEDs. In FIG. 7C, 32 words of digital data must be stored in a single long shift register before data is provided on 32 parallel outputs to current drivers 353, which then control the current or duty cycle of the single row of 32 LEDs in LED arrays 505.

Referring to FIG. 7D, only a single shift register 355A is shown for illustrative purposes. In FIG. 7D, latch signaling from the interface circuit 351 passes to the shift register 355A through a demultiplexer 502 that may also be coupled to other shift registers that are not shown. The demultiplexer 502 acts as a register switch to provide the latch signal only to an active shift register, which prevents the remaining shift registers from shifting in incoming serial data. The demultiplexer is controlled by an address select signal to select the active shift register. A scan select signal or other control signal, a scan timer, or the ordering of latch signals may also be used to control the demultiplexer 502. In other embodiments, the demultiplexer 502 acts as a data switch to pass serial data to the shift registers in accordance with, for example, the number of words received by a data counter.

Referring again to FIG. 7D, when the shift register 355A is full of 16 words of stored digital data, it then provides this data on 16 parallel outputs to a current driver 353, which then controls the current or duty cycle of 8 scan groups comprising one or more rows of 16 LEDs each in LED arrays 505. The shift register 355A receives data intended for the Nth LED row (the first row of the Nth scan group) during the Nth scan period. The power supply unit 370 includes a scan controller 700 that couples power to an active scan group in accordance with the address select signal provided by the receiver unit 140 to synchronize the demultiplexer 502 and scan controller 700. A scan select signal or scan timer may also be used to synchronize the scan controller 700. In other embodiments, the scan controller 700 is located outside the power supply unit 370 and may couple current from the current driver 353 to the LED arrays 505. In FIG. 7D, the scan controller 700 is an array of switches 504, which may be implemented, for example, as an array of transistors. The scan controller 700 may also be implemented using one or more demultiplexers.

Referring to FIG. 7E, the difference between this embodiment and the embodiment of FIG. 7D is that the rows of LEDs in LED arrays 505 are organized into only 4 scan groups of at least two rows each. The scan controller 700 switches power to pairs of rows in each of the 4 scan groups. When each of the two illustrated shift registers 355A is full of 16 words of stored digital data, it then provides this data on 16 parallel outputs to a current driver 353, which then controls the current or duty cycle of one row in each of the 4 scan groups. The demultiplexer 502 and the two shift registers 355A and two current drivers 353 are all components of the LED controller 359. In other embodiments, the demultiplexer 502 is located outside multiple LED controllers that each include only one shift register 355A and current driver 353 such that the demultiplexer 502 only activates one LED controller at a time.

Referring again to FIG. 7E, a first shift register provides data to control current to a first row in each of the 4 scan groups, and the second shift register provides data to control current to a second row in each of the 4 scan groups. In other embodiments, other numbers of shift registers may be used, and data for multiple rows in a scan group may be provided by a single scan group.

Figure 8:
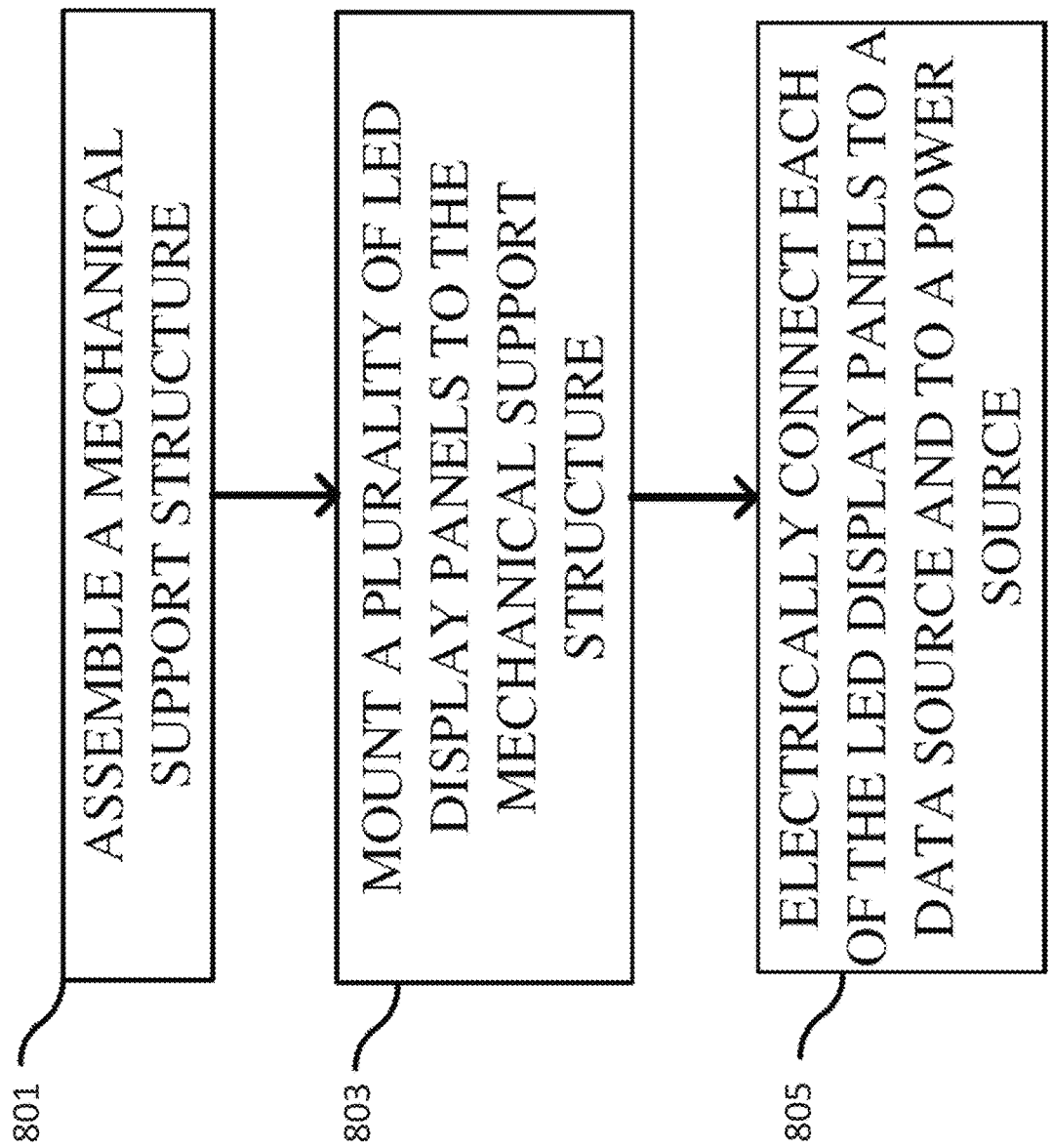
FIG. 8 illustrates a method of assembling the modular multi-panel display system in accordance with embodiments of the present invention.

FIG. 8 illustrates a method of assembling the modular multi-panel display system discussed in various embodiments. A mechanical support structure such as the frame 110 described in FIG. 1 above is assembled taking into account various parameters such as the size and weight of the multi-panel display, location and zoning requirements, and others (box 801). For example, as previously described, the mechanical support structure includes a plurality of vertical bars and horizontal bars. The mechanical support structure may be fabricated from a corrosion resistant material in one or more embodiments. For example, the mechanical support structure may be coated with a weather-proofing coating that prevents the underlying substrate from corroding.

A plurality of LED display panels are mounted on to the mechanical support structure so as to form an integrated display panel that includes an array of rows and columns of LED display panels as described in various embodiments (box 803). Each of the LED display panels is hermetically sealed. Mounting the LED display panels may comprise mounting each LED display panel to a vertical or horizontal beam using an attachment plate.

Each of the LED display panels is electrically connected to a data source and to a power source (box 805). For example, a first LED display panel in each row is electrically coupled to a receiver unit. The other LED display panels in each row may be daisy-chain coupled to an adjacent LED display panel. In embodiments that are dynamically adaptable, no further configuration of the data source is necessary. In pre-configured embodiments, the data source is configured with information related to, for example, the number of LED display panels and the resolution and pitch of each LED display panel in each daisy-chained row.

Since the assembled display structure is light weight, significant assembly advantages can be achieved. For example, the panels can be assembled within a warehouse that is remote from the final location where the display will be utilized. In other words, the panels can be assembled at a first location, shipped to second location and finalized at the second location.

Figure 9:
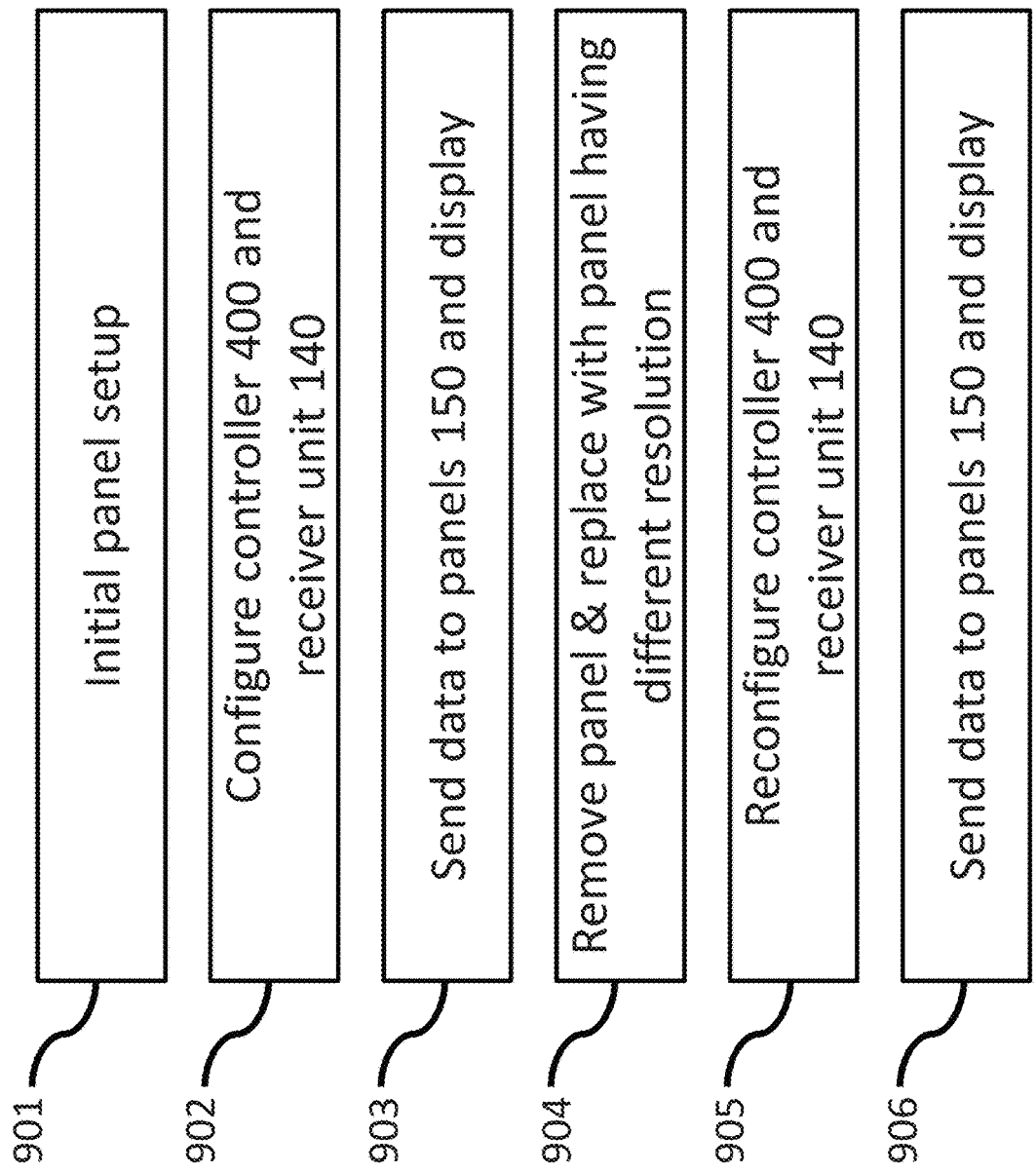
FIG. 9 illustrates a method of configuring and displaying data on the modular multi-panel display system in accordance with embodiments of the present invention.

In FIG. 9, a method of configuring and displaying data on the modular multi-panel display system in accordance with pre-configured embodiments of the present invention is illustrated. The panel is initially set up with mechanical and electrical connections in accordance with the method of FIG. 8 (box 901). The controller 400 and receiver unit 140 are then configured with information about individual LED display panels 150, including, for example, the panels' resolutions, pixel counts/local video frame sizes, number of scan groups, and number of rows and columns of each scan group. (box 902). In other embodiments, the modular display system is dynamically adaptable so that the LED display panels 150 send panel information to the receiver unit 140, which forwards some of all of this panel information to the controller 400. In accordance with the panel information, the controller 400 sends data to the receiver unit 140, which then sends data for display at the LED display panels 150 (box 903). As an example, an LED display panel 150 may be removed and replaced with a panel having a different resolution (box 904). The controller 400 and receiver unit 140 are then re-configured by an operator with updated panel information that includes the new resolution information (box 905). In dynamically adaptable embodiments, the LED display panels 150 send panel information to the receiver unit 140 and then to the controller 400. In accordance with this updated panel information, the controller 400 again sends data to the receiver unit 140, which then sends data again for display at the LED display panels 150 (box 906).

Although embodiments of the present invention have been described as being LED display panels, various embodiments of the present invention may also be applied to any type of display panel including organic display including passive-matrix or active-matrix displays, organic transistor based displays, micro-mirror displays, plasma display, liquid crystal display, surface-conduction electron-emitter display, field emission display, and others.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A modular light-emitting diode (LED) display panel comprising:
   attachment points for use in attachment as part of a multi-panel modular LED display;
   a printed circuit board comprising a first side and an opposite second side;
   a driver circuit electrically coupled to the printed circuit board;
   a plastic casing attached to the opposite second side of the printed circuit board, a perimeter of the plastic casing being substantially rectangular and having a height and a width; and
   a display surface comprising a plurality of LEDs arranged as pixels and attached to the first side of the printed circuit board, wherein the pixels are arranged in a rectangular array comprising at least fifty pixels, and wherein
      each of the pixels of the rectangular array is a surface mount device (SMD) module comprising a plurality of LED devices and a top surface, the top surface being exposed to an external environment,
      each of the pixels of the rectangular array is spaced from each respective adjacent pixel of the rectangular array by a pitch, the pitch is a predetermined constant number, the modular LED display panel being configured to be swapped with another modular LED display panel having a pitch different from the pitch of the modular LED display panel while having the same height as the height of the modular LED display panel and the same width as the width of the modular LED display panel.

2. The modular LED display panel according to claim 1, further comprising a sealing compound overlying the first side of the printed circuit board, wherein the display surface protected from water by the sealing compound.

3. The modular LED display panel according to claim 1, wherein the plastic casing is a water-sealed plastic casing, and wherein the driver circuit is protected from water by the water-sealed plastic casing.

4. The modular LED display panel according to claim 1, wherein the modular LED display panel is configured to be operational when submerged in water up to a depth of at least one meter.

5. The modular LED display panel according to claim 1, wherein the plastic casing comprises plastic sidewalls and a plastic back surface configured to be exposed to the external environment without additional enclosures.

6. The modular LED display panel according to claim 1, wherein the driver circuit is directly attached to the opposite second side of the printed circuit board, and wherein the plastic casing encloses the driver circuit.

7. The modular LED display panel according to claim 1, further comprising:
   a power supply for powering the plurality of LEDs, the power supply comprising a power converter for converting alternating current (AC) power to direct current (DC) power; and
   a power supply housing mounted outside the plastic casing, the power supply being disposed in the power supply housing, wherein the power supply housing and the power supply form a power supply unit.

8. The modular LED display panel according to claim 1, further comprising a power supply disposed within the plastic casing.

9. The modular LED display panel according to claim 1, wherein the height is at least half of the width.

10. The modular LED display panel according to claim 9, wherein, a ratio of the height to the width is at least 1:2 to at most 3:4.

11. The modular LED display panel according to claim 10, wherein the height is half of the width.

12. A modular light-emitting diode (LED) display sub-assembly comprising:
   a front side and an opposite back side, wherein the front side of the modular LED display sub-assembly comprises a display surface of the modular LED display sub-assembly;
   a frame comprising a top horizontal member, a bottom horizontal member, a left vertical member, and a right vertical member;
   a plurality of modular LED display panels attached to the frame, wherein all of the plurality of modular LED display panels have a substantially rectangular perimeter and the same length, width, height, and shape, wherein each of the plurality of modular LED display panels comprises:
   attachment points facilitating attachment of the modular LED display panel to the frame;
   a printed circuit board comprising a first side and an opposite second side;
   a driver circuit electrically coupled to the printed circuit board;
   a casing attached to the opposite second side of the printed circuit board; and
   a plurality of LEDs arranged as pixels and attached to the first side of the printed circuit board, wherein the pixels are arranged in a rectangular array comprising at least fifty pixels as part of the display surface, and wherein
      each of the pixels of the rectangular array is a surface mount device (SMD) module comprising a plurality of LED devices and a top surface, the top surface being exposed to an external environment,
      each of the pixels of the rectangular array is spaced from each respective adjacent pixel of the rectangular array by a pitch, the pitch is a predetermined constant number, and each of the plurality of the modular LED display panels being configured to be swapped with another modular LED display panel having a pitch different from the pitch of a modular LED display panel being swapped while having the same height as the height of the modular LED display panel being swapped and the same width as the width of the modular LED display panel being swapped.

13. The modular LED display sub-assembly according to claim 12,
   wherein the plurality of modular LED display panels comprises a first LED modular display panel attached to the frame and a second LED modular display panel attached the frame, and
   wherein the pitch of the rectangular array of the first modular LED display panel is different from the pitch of the rectangular array of the second modular LED display panel.

14. The modular LED display sub-assembly according to claim 12, wherein each of the plurality of modular LED display panels further comprises a sealing compound overlying the first side of the printed circuit board, wherein the display surface is protected from water by the sealing compound.

15. The modular LED display sub-assembly according to claim 12, wherein, for each of the plurality of modular LED display panels, the first side of the printed circuit board is water-sealed and the opposite second side of the printed circuit board with the casing is water-sealed.

16. The modular LED display sub-assembly according to claim 12, wherein the modular LED display sub-assembly is configured to be operational when submerged in water up to a depth of at least one meter.

17. A modular light-emitting diode (LED) display panel comprising:
   attachment points for use in attachment as part of a multi-panel modular LED display;
   a printed circuit board comprising a first side and an opposite second side;
   a water-sealed plastic casing attached to the opposite second side of the printed circuit board, a perimeter of the water-sealed plastic casing being substantially rectangular and having a height and a width;
   a driver circuit electrically coupled to the printed circuit board, the driver circuit being directly attached to the opposite second side of the printed circuit board, wherein the water-sealed plastic casing encloses the driver circuit; and
   a display surface comprising a plurality of surface mount device (SMD) LED modules arranged as pixels and attached to the first side of the printed circuit board, wherein the pixels are arranged in a rectangular array comprising at least fifty pixels, and wherein
   each of the pixels of the rectangular array is spaced from each respective adjacent pixel of the rectangular array by a pitch, the pitch is a predetermined constant number, and the modular LED display panel being configured to be swapped with another modular LED display panel having a pitch different from the pitch of the modular LED display panel while having the same height as the height of the modular LED display panel and the same width as the width of the modular LED display panel.

18. The modular LED display panel according to claim 17, wherein the modular LED display panel is configured to be operational when submerged in water up to a depth of at least one meter.

19. The modular LED display panel according to claim 17, further comprising:
   a power supply for powering the plurality of SMD LED modules, the power supply comprising a power converter for converting alternating current (AC) power to direct current (DC) power; and
   a power supply housing mounted outside the water-sealed plastic casing, the power supply being disposed in the power supply housing, wherein the power supply housing and the power supply form a power supply unit.

20. The modular LED display panel according to claim 17, further comprising a power supply disposed within the water-sealed plastic casing.

* * * * *